US012235581B2

(12) United States Patent
Park et al.

(10) Patent No.: US 12,235,581 B2
(45) Date of Patent: Feb. 25, 2025

(54) METHOD AND APPARATUS FOR TREATING SUBSTRATE

(71) Applicant: SEMES CO., LTD., Cheonan-si (KR)

(72) Inventors: Min Jung Park, Daegu (KR); Jung Yul Lee, Cheongju-si (KR)

(73) Assignee: SEMES CO., LTD., Cheonan-si (KR)

( * ) Notice: Subject to any disclaimer, the term of this patent is extended or adjusted under 35 U.S.C. 154(b) by 220 days.

(21) Appl. No.: 17/336,261

(22) Filed: Jun. 1, 2021

(65) Prior Publication Data

US 2021/0373440 A1 Dec. 2, 2021

(30) Foreign Application Priority Data

Jun. 2, 2020 (KR) .................. 10-2020-0066635

(51) Int. Cl.
*G03F 7/16* (2006.01)
*B05B 1/02* (2006.01)

(52) U.S. Cl.
CPC .............. *G03F 7/162* (2013.01); *B05B 1/02* (2013.01); *G03F 7/168* (2013.01)

(58) Field of Classification Search
CPC .................................. G03F 7/162; G03F 7/168
See application file for complete search history.

(56) References Cited

U.S. PATENT DOCUMENTS

| | | | |
|---|---|---|---|
| 2002/0160319 A1* | 10/2002 | Endo | G03F 7/162 430/935 |
| 2009/0191720 A1* | 7/2009 | Nakagawa | H01L 21/6715 438/782 |
| 2010/0233637 A1* | 9/2010 | Arima | H01L 21/6715 700/121 |

FOREIGN PATENT DOCUMENTS

| | | |
|---|---|---|
| JP | 2002-353091 | 12/2002 |
| JP | 2002-361167 | 12/2002 |
| JP | 2007-067059 | 3/2007 |
| JP | 2017-183576 | 10/2017 |
| JP | 2019-075413 | 5/2019 |
| KR | 100268314 | 7/2000 |
| KR | 1020060027696 | 3/2006 |
| KR | 10-1529741 | 9/2010 |
| KR | 1020190125469 | 11/2019 |

OTHER PUBLICATIONS

Office Action from the Korean Intellectual Property Office dated Aug. 31, 2023.

* cited by examiner

*Primary Examiner* — James M Mellott

(57) ABSTRACT

The inventive concept provides a method for treating a substrate. In the substrate treating method, a liquid film is formed by supplying a treatment liquid to the rotating substrate, and a wetting medium is sprayed in a form of fine particles to the substrate to help diffusion of the liquid film.

15 Claims, 28 Drawing Sheets

METHOD AND APPARATUS FOR TREATING SUBSTRATE

CROSS-REFERENCE TO RELATED APPLICATIONS

This application claims priority under 35 U.S.C. § 119 to Korean Patent Application No. 10-2020-0066635 filed on Jun. 2, 2020, in the Korean Intellectual Property Office, the entire contents of which are hereby incorporated by reference.

BACKGROUND

Embodiments of the inventive concept described herein relate to a method and apparatus for treating a substrate, and more particularly, relate to a substrate treating method and apparatus for treating a substrate by supplying a liquid to the substrate.

Various processes, such as a photolithography process, an etching process, an ashing process, a thin-film deposition process, a cleaning process, and the like, are performed to manufacture semiconductor elements or flat display panels. Among these processes, the photolithography process is a process of supplying photoresist to a semiconductor substrate to form a coating film on a substrate surface, exposing the formed coating film to light using a mask, and supplying a developing solution to obtain a desired pattern on the substrate. In particular, to achieve scaling-down of a critical dimension (CD) of a pattern, a high level of uniformity is required for the coating film formed in the coating process.

In general, a process of forming a coating film on a substrate surface is performed by a method of, as illustrated in FIG. 1, rotating a substrate W by a chuck 2 that supports the substrate W, such as a wafer, and supplying photoresist PR to the rotating substrate W by a photoresist nozzle 4. The photoresist PR supplied by the photoresist nozzle 4 is supplied to a central region of the substrate W and is spread toward an edge region of the substrate W by a centrifugal force generated by the rotation of the substrate W. Accordingly, the photoresist PR supplied to the substrate W forms a coating film.

When the photoresist PR used in the coating-film forming process has a high viscosity (e.g., 300 cP or more), it is difficult to uniformly form the thickness of the coating film. As described above, the photoresist PR supplied to the central region of the substrate W is spread toward the edge region of the substrate W by the centrifugal force generated by the rotation of the substrate W. However, when the photoresist PR has a high viscosity, the photoresist PR is not appropriately spread toward the edge region of the substrate W. Therefore, tearing or poor coating may occur in the formed coating film. Furthermore, uniformity of the coating film may be significantly deteriorated. The aforementioned problems noticeably occur in a region adjacent to the edge region of the substrate W because the rotating speed of the substrate W is gradually increased away from the center of the substrate W.

SUMMARY

Embodiments of the inventive concept provide a substrate treating method and apparatus for efficiently treating a substrate.

Furthermore, embodiments of the inventive concept provide a substrate treating method and apparatus for improving uniformity of a liquid film formed on a substrate.

In addition, embodiments of the inventive concept provide a substrate treating method and apparatus for minimizing defects, such as tearing and/or poor coating, in a liquid film formed on a substrate.

The technical problems to be solved by the inventive concept are not limited to the aforementioned problems, and any other technical problems not mentioned herein will be clearly understood from this specification and the accompanying drawings by those skilled in the art to which the inventive concept pertains.

According to an embodiment, a method for treating a substrate is provided. In the method, a liquid film is formed by supplying a treatment liquid to the rotating substrate, and a wetting medium is sprayed in a form of fine particles to the substrate to help diffusion of the liquid film.

According to an embodiment, the wetting medium may be sprayed in a form of mist.

According to an embodiment, the wetting medium may be sprayed toward an edge region of the substrate.

According to an embodiment, a position where the wetting medium is supplied to the substrate may be farther away from the center of the substrate than a position where the treatment liquid is supplied to the substrate.

According to an embodiment, the wetting medium may be sprayed after the supply of the treatment liquid starts and set time passes.

According to an embodiment, the wetting medium may be further sprayed for a set period of time after the supply of the treatment liquid is stopped.

According to an embodiment, the method may include a first step of supplying the treatment liquid and rotating the substrate at first speed and a second step of rotating the substrate at second speed different from the first speed, and the wetting medium may be sprayed to the substrate in at least one of the first step and the second step.

According to an embodiment, the method may further include a third step of rotating the substrate at third speed higher than the first speed and the second speed, and the wetting medium may be sprayed to the substrate in at least one of the first step, the second step, and the third step.

According to an embodiment, when the wetting medium is sprayed to the substrate in the third step, the spray of the wetting medium may be stopped before the third step ends.

According to an embodiment, a method for treating a substrate is provided. In the method, a liquid film is formed by supplying a coating solution to the rotating substrate, and a wetting medium that suppresses evaporation of a solvent contained in the liquid film is sprayed in a form of fine particles to the substrate.

According to an embodiment, the wetting medium may be sprayed in a form of mist.

According to an embodiment, the coating solution may be supplied toward a central region of the substrate, and the wetting medium may be sprayed toward an edge region of the substrate.

According to an embodiment, time during which the wetting medium is sprayed and time during which the coating solution is supplied may at least partially overlap each other.

According to an embodiment, time to start spraying the wetting medium may be later than time to start supplying the coating solution.

According to an embodiment, time to start spraying the wetting medium may be earlier than time to start supplying the coating solution.

According to an embodiment, time to stop spraying the wetting medium may be later than time to stop supplying the coating solution.

According to an embodiment, a method for treating a substrate is provided. In the method, a liquid film is formed by supplying a light-sensitive liquid to the rotating substrate, and thinner is sprayed in a form of mist into a treatment space to adjust a degree of evaporation of a solvent contained in the liquid film, the substrate being treated in the treatment space.

According to an embodiment, the thinner may be sprayed such that concentration per unit volume of the thinner varies depending on regions of the substrate viewed from above.

According to an embodiment, the concentration per unit volume of the thinner sprayed into the treatment space may be higher in an edge region of the substrate than in a central region of the substrate viewed from above.

According to an embodiment, the method may include a coating step of supplying the light-sensitive liquid to the substrate rotating at first speed, a thickness adjustment step of stopping the supply of the light-sensitive liquid and rotating the substrate at second speed lower than the first speed, and a drying step of drying the liquid film by rotating the substrate at third speed higher than the second speed. The thinner may be sprayed into the treatment space in at least one of the coating step, the thickness adjustment step, and the drying step.

According to an embodiment, an apparatus for treating a substrate includes a support unit that supports and rotates the substrate in a treatment space, a liquid supply unit that supplies a treatment liquid to the substrate supported on the support unit, and a wetting unit that sprays a wetting medium in a form of fine particles to the substrate, in which the wetting medium helps diffusion of the treatment liquid.

According to an embodiment, the wetting unit may spray the wetting medium toward an edge region of the substrate supported on the support unit.

According to an embodiment, the apparatus may further include a treatment vessel having the treatment space, and the wetting unit may include a wetting medium nozzle installed on the treatment vessel.

According to an embodiment, the wetting medium nozzle may adjust a spray region of the wetting medium sprayed toward the substrate supported on the support unit.

According to an embodiment, the apparatus may further include a housing having an inner space surrounding the treatment space and an air-flow supply unit that supplies a downward air flow into the inner space. The wetting unit may be installed in the air-flow supply unit to spray the wetting medium toward the substrate supported on the support unit.

According to an embodiment, the liquid supply unit may include a treatment liquid nozzle that supplies the treatment liquid and a first arm that supports the treatment liquid nozzle, and the wetting unit may include a wetting medium nozzle that sprays the wetting medium and a second arm that supports the wetting medium nozzle.

According to an embodiment, the liquid supply unit may include a first arm having the treatment liquid nozzle installed thereon, the wetting unit may include a second arm driven independently of the first arm, and a wetting medium nozzle that sprays the wetting medium and a pre-wetting nozzle that supplies a pre-wetting liquid in a manner of a stream may be installed on the second arm.

According to an embodiment, the apparatus may further include a controller that controls the support unit, the liquid supply unit, and the wetting unit, and the controller may control the liquid supply unit, the support unit, and the wetting unit to supply the treatment liquid to a central region of the rotating substrate supported on the support unit and spray the wetting medium to an edge region of the substrate supported on the support unit.

According to an embodiment, the controller may control the liquid supply unit and the wetting unit to spray the wetting medium from when the treatment liquid supplied to the central region of the substrate reaches the edge region of the substrate.

According to an embodiment, the controller may control the liquid supply unit and the wetting unit to spray the wetting medium after the supply of the treatment liquid starts and set time passes.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
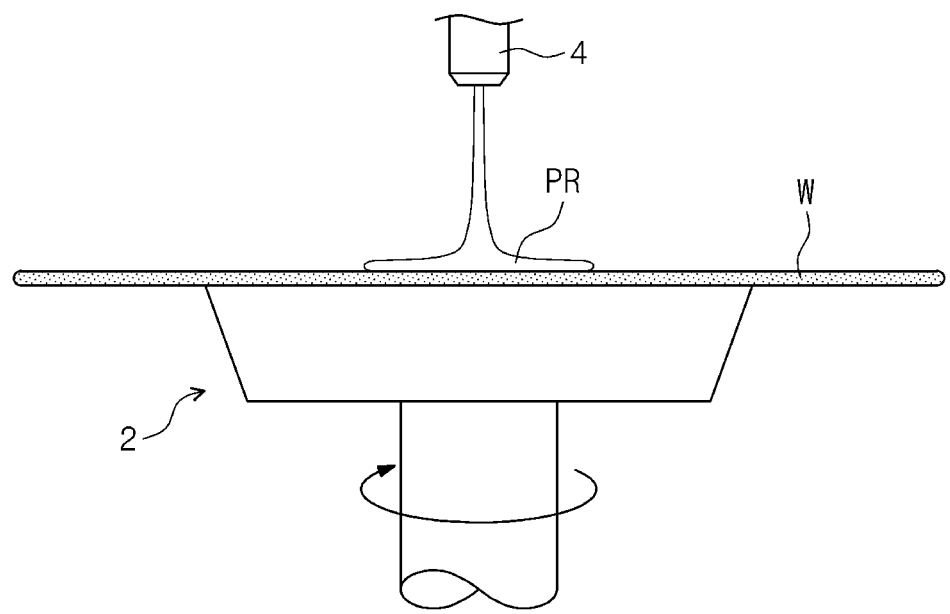
FIG. 1 is a view illustrating a general substrate treating method of forming a coating film on a substrate.

Hereinafter, embodiments of the inventive concept will be described in detail with reference to the accompanying drawings such that those skilled in the art to which the inventive concept pertains can readily carry out the inventive concept. However, the inventive concept may be implemented in various different forms and is not limited to the embodiments described herein. Furthermore, in describing the embodiments of the inventive concept, detailed descriptions related to well-known functions or configurations will be omitted when they may make subject matters of the inventive concept unnecessarily obscure. In addition, components performing similar functions and operations are provided with identical reference numerals throughout the accompanying drawings.

The terms "include" and "comprise" in the specification are "open type" expressions just to say that the corresponding components exist and, unless specifically described to the contrary, do not exclude but may include additional components. Specifically, it should be understood that the terms "include", "comprise", and "have", when used herein, specify the presence of stated features, integers, steps, operations, components, and/or parts, but do not preclude the presence or addition of one or more other features, integers, steps, operations, components, parts, and/or groups thereof.

The terms of a singular form may include plural forms unless otherwise specified. Furthermore, in the drawings, the shapes and dimensions of components may be exaggerated for clarity of illustration.

Figure 2:
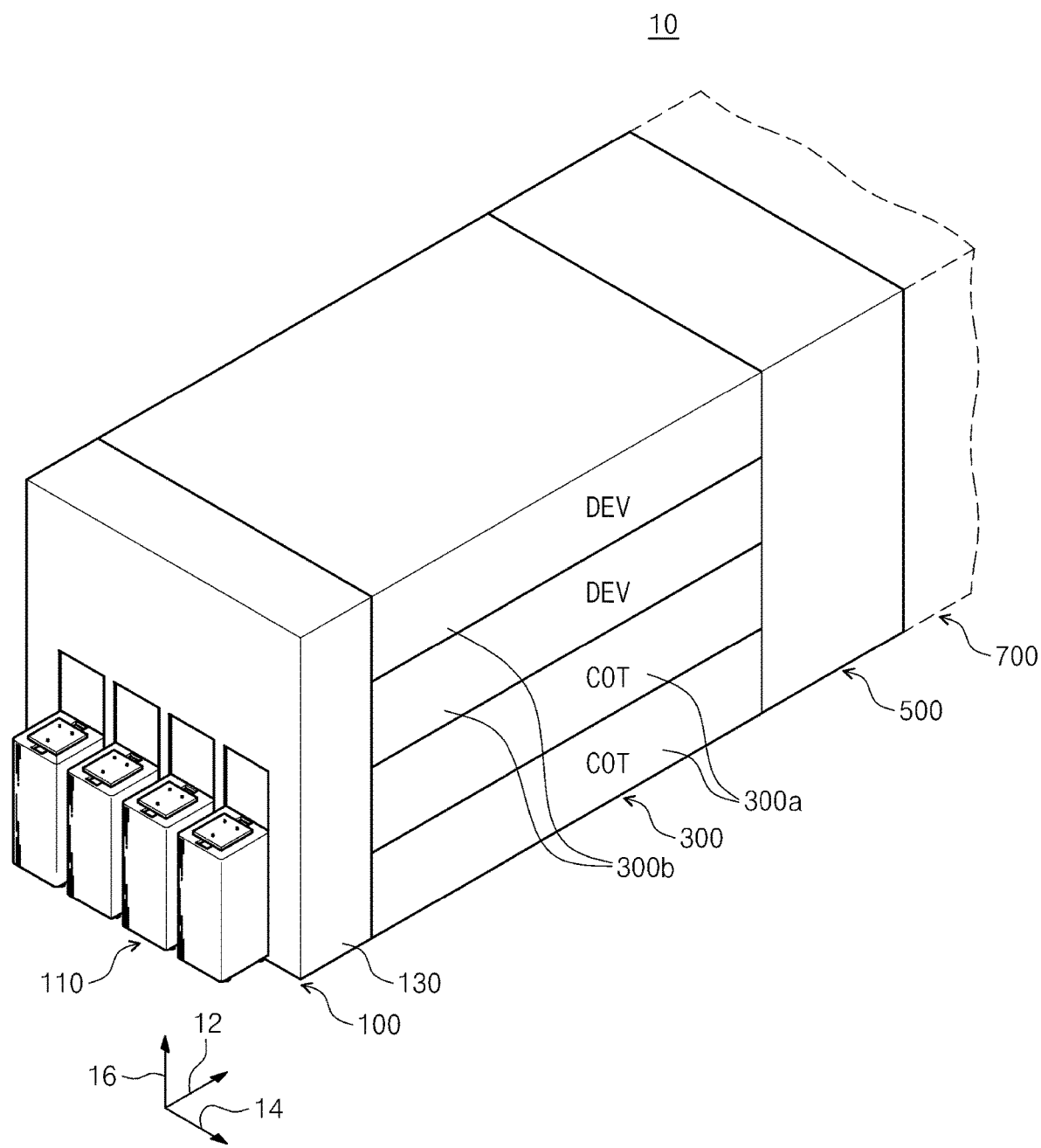
FIG. 2 is a schematic perspective view illustrating a substrate treating apparatus according to an embodiment of the inventive concept.
Figure 3:
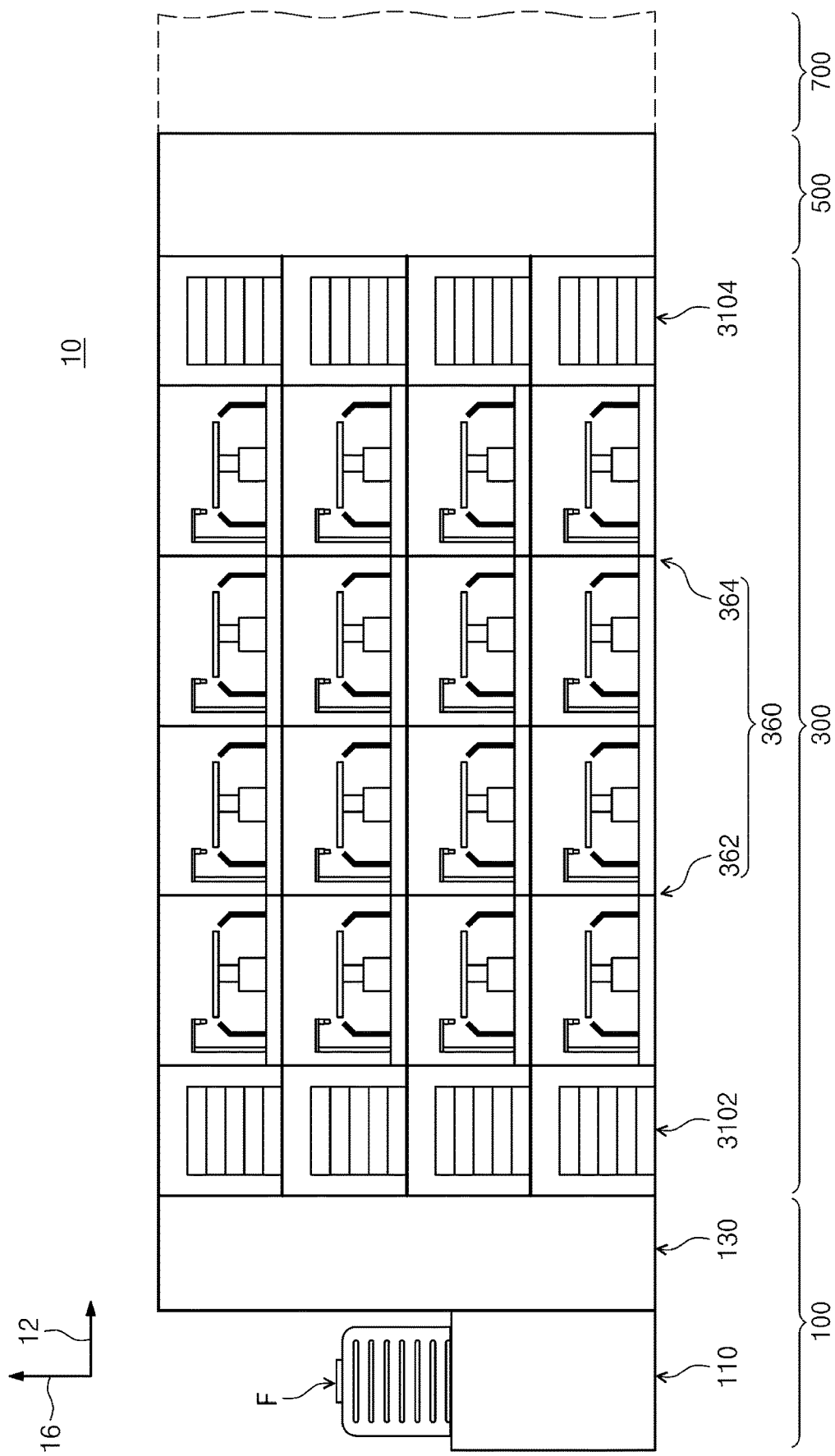
FIG. 3 is a sectional view illustrating coating blocks and developing blocks of the substrate treating apparatus of FIG. 2.
Figure 4:
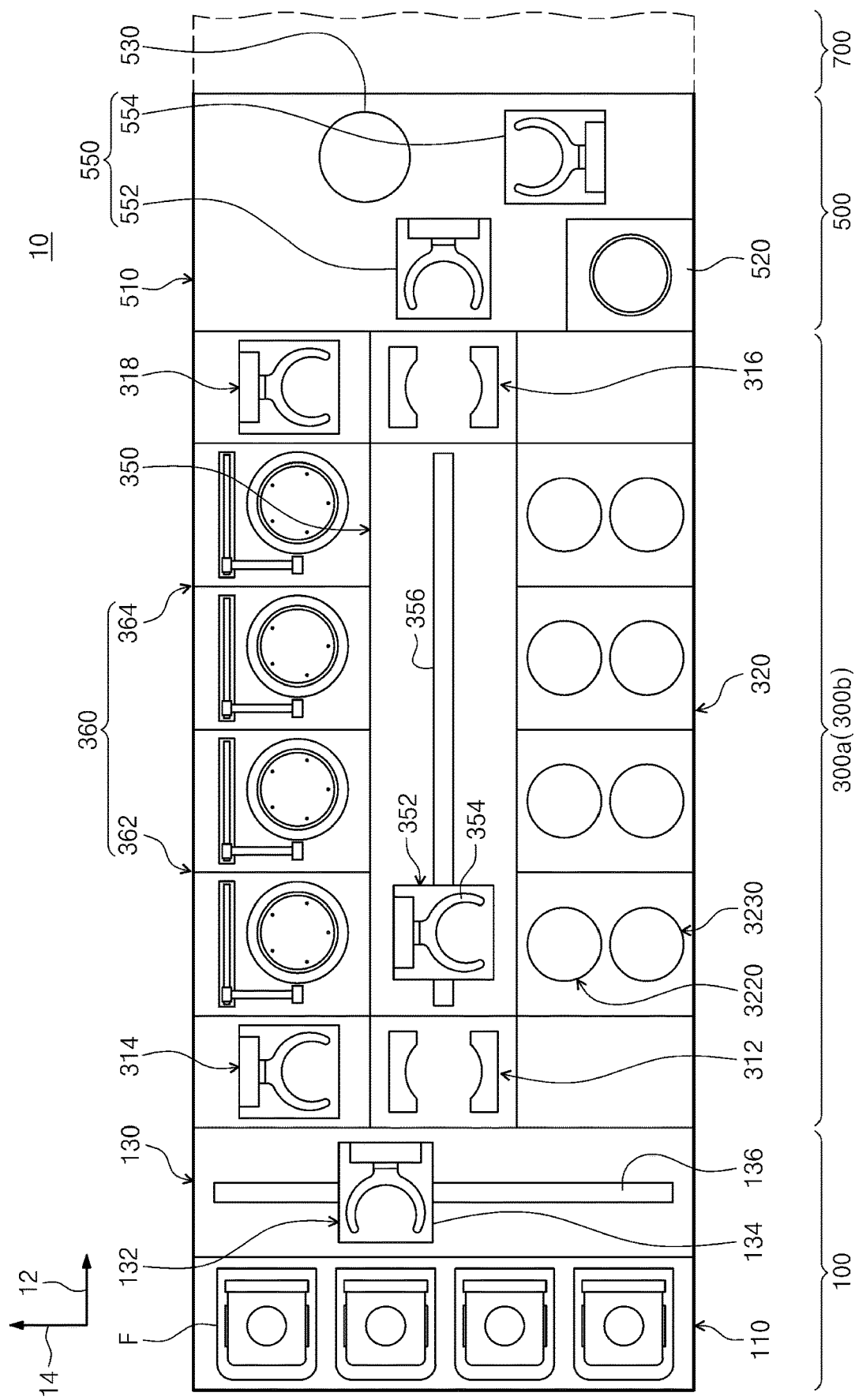
FIG. 4 is a plan view of the substrate treating apparatus of FIG. 2.

Hereinafter, a substrate treating apparatus according to an embodiment of the inventive concept will be described in detail. FIG. 2 is a schematic perspective view illustrating the substrate treating apparatus according to the embodiment of the inventive concept. FIG. 3 is a sectional view illustrating coating blocks and developing blocks of the substrate treating apparatus of FIG. 2. FIG. 4 is a plan view of the substrate treating apparatus of FIG. 2.

Referring to FIGS. 2 to 4, the substrate treating apparatus 10 according to the embodiment of the inventive concept includes an index module 100, a treating module 300, and an interface module 500. According to an embodiment, the index module 100, the treating module 300, and the interface module 500 are sequentially disposed in a row. Hereinafter, a direction in which the index module 100, the treating module 300, and the interface module 500 are arranged is referred to as a first direction 12, a direction perpendicular to the first direction 12 when viewed from above is referred to as a second direction 14, and a direction perpendicular to both the first direction 12 and the second direction 14 is referred to as a third direction 16.

The index module 100 transfers substrates W from carriers F having the substrates W received therein to the treating module 300 and places the completely treated substrates W in the carriers F. The index module 100 is disposed such that the lengthwise direction thereof is parallel to the second direction 14. The index module 100 has load ports 110 and an index frame 130. The load ports 110 are located on the opposite side to the treating module 300 with respect to the index frame 130. The carriers F having the substrates W received therein are placed on the load ports 110. The load ports 110 may be disposed along the second direction 14.

Airtight carriers F such as front open unified pods (FOUPs) may be used as the carriers F. The carriers F may be placed on the load ports 110 by a transfer unit (not illustrated) such as an overhead transfer, an overhead conveyor, or an automatic guided vehicle, or by an operator.

An index robot 132 is provided in the index frame 130. A guide rail 136, the lengthwise direction of which is parallel to the second direction 14, is provided in the index frame 130. The index robot 132 is movable on the guide rail 136. The index robot 132 includes hands 134 on which the substrates W are placed. The hands 134 are movable forward and backward, rotatable about an axis facing the third direction 16, and movable along the third direction 16.

The treating module 300 may perform a coating process and a developing process on the substrates W. The treating module 300 has the coating blocks 300a and the developing blocks 300b. The coating blocks 300a perform the coating process on the substrates W, and the developing blocks 300b perform the developing process on the substrates W. The coating blocks 300a are stacked on each other. The developing blocks 300b are stacked on each other. According to the embodiment of FIG. 2, two coating blocks 300a and two developing blocks 300b are provided. The coating blocks 300a may be disposed under the developing blocks 300b. According to an embodiment, the two coating blocks 300a may perform the same process and may have the same structure. Furthermore, the two developing blocks 300b may perform the same process and may have the same structure.

Referring to FIG. 4, the coating blocks 300a have heat treatment chambers 320, a transfer chamber 350, liquid treatment chambers 360, and buffer chambers 312 and 316. The heat treatment chambers 320 perform a heat treatment process on the substrates W. The heat treatment process may include a cooling process and a heating process. The liquid treatment chambers 360 form liquid films on the substrates W by supplying a liquid to the substrates W. The liquid films may be photoresist films or anti-reflection films. The transfer chamber 350 transfers the substrates W between the heat treatment chambers 320 and the liquid treatment chambers 360 in the coating block 300a.

The transfer chamber 350 is disposed such that the lengthwise direction thereof is parallel to the first direction 12. A transfer robot 352 is provided in the transfer chamber 350. The transfer robot 352 transfers the substrates W between the heat treatment chambers 320, the liquid treatment chambers 360, and the buffer chambers 312 and 316. According to an embodiment, the transfer robot 352 has a hand 354 on which the substrate W is placed, and the hand 354 is movable forward and backward, rotatable about an axis facing the third direction 16, and movable along the third direction 16. A guide rail 356, the lengthwise direction of which is parallel to the first direction 12, is provided in the transfer chamber 350, and the transfer robot 352 is movable on the guide rail 356.

Figure 5:
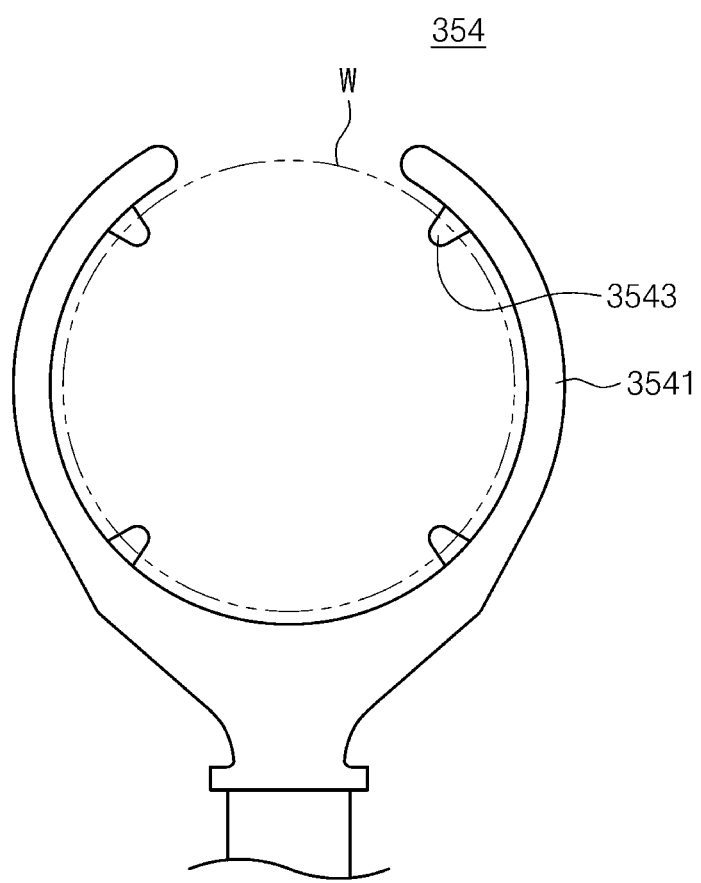
FIG. 5 is a view illustrating one example of a hand of a transfer robot of FIG. 4.

FIG. 5 is a view illustrating one example of the hand of the transfer robot of FIG. 4. Referring to FIG. 5, the hand 354 has a base 3541 and support protrusions 3543. The base 3541 may have an annular ring shape, the circumference of which is partly curved. The base 3541 has an inner diameter larger than the diameter of the substrate W. The support protrusions 3543 extend inward from the base 3541. The support protrusions 3543 support an edge region of the substrate W. According to an embodiment, four support protrusions 3543 may be provided at equal intervals.

The heat treatment chambers 320 are arranged along the first direction 12. The heat treatment chambers 320 are located on one side of the transfer chamber 350.

Figure 6:
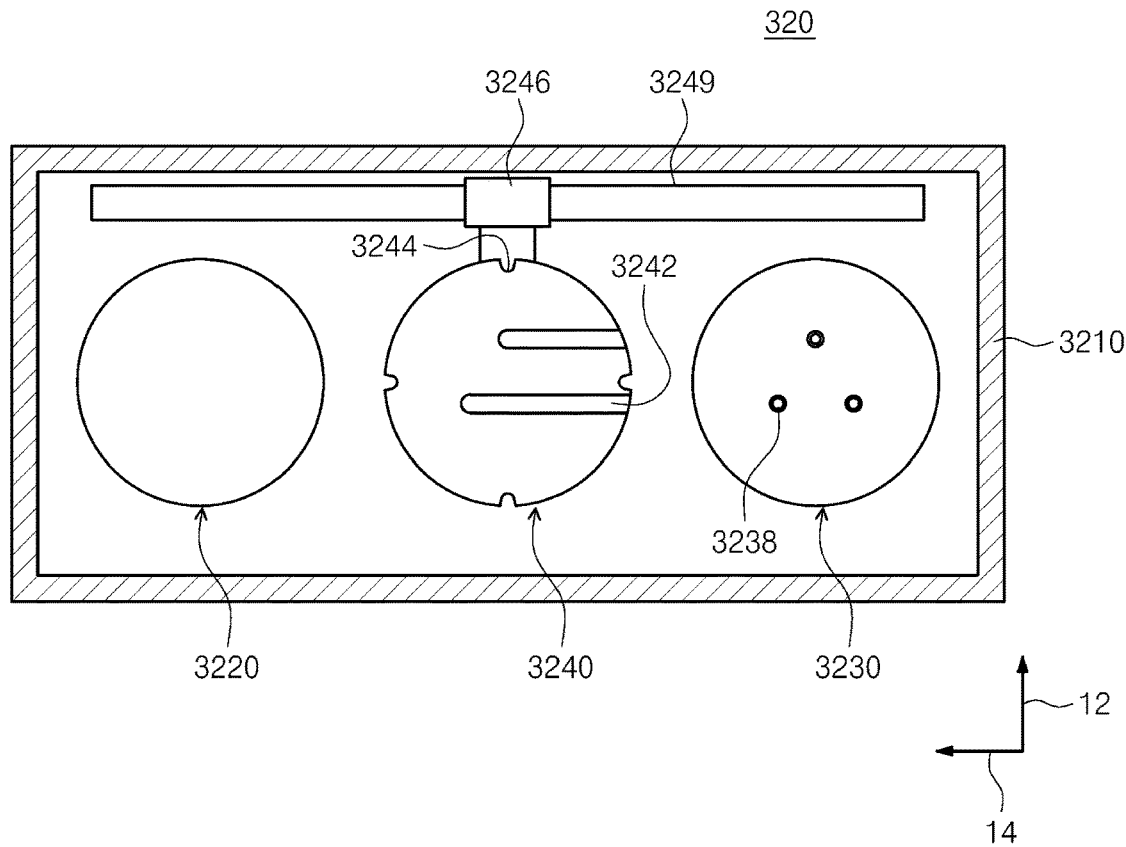
FIG. 6 is a schematic plan view illustrating one example of heat treatment chambers of FIG. 4.
Figure 7:
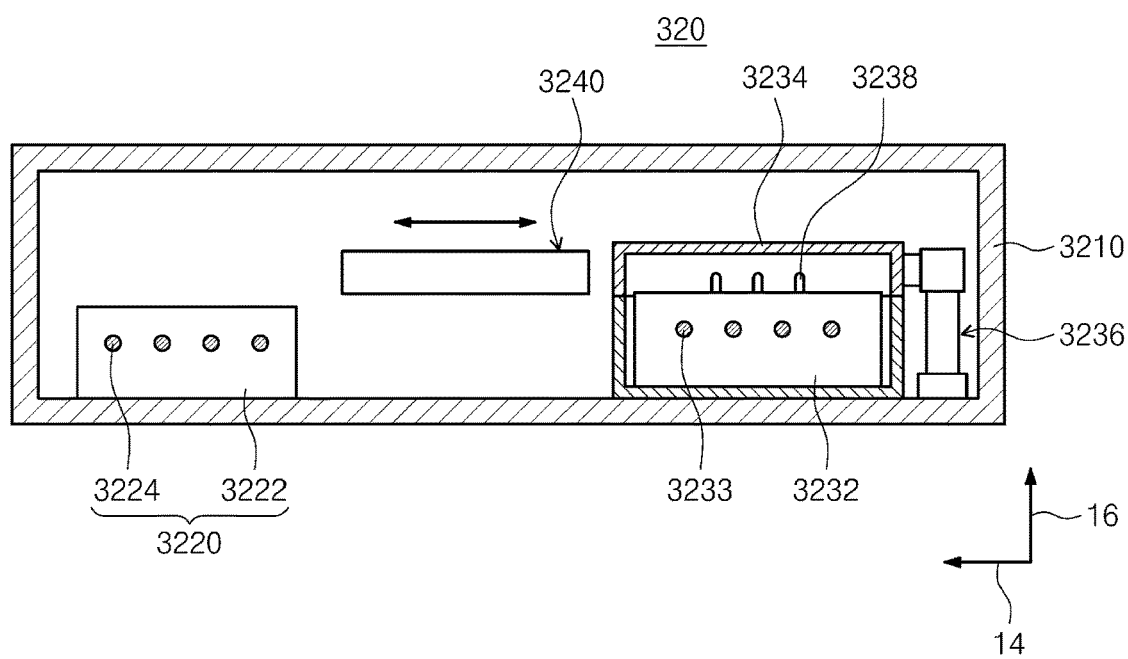
FIG. 7 is a front view of the heat treatment chamber of FIG. 6.

FIG. 6 is a schematic plan view illustrating one example of the heat treatment chambers of FIG. 4, and FIG. 7 is a front view of the heat treatment chamber of FIG. 6. Referring to FIGS. 6 and 7, the heat treatment chamber 320 has a housing 3210, a cooling unit 3220, a heating unit 3230, and a transfer plate 3240.

The housing 3210 has a substantially rectangular parallelepiped shape. The housing 3210 has, in a sidewall thereof, an entrance/exit opening (not illustrated) through which the substrate W enters and exits the housing 3210. The entrance/exit opening may remain open. Selectively, a door (not illustrated) may be provided to open and close the entrance/exit opening. The cooling unit 3220, the heating unit 3230, and the transfer plate 3240 are provided in the housing 3210. The cooling unit 3220 and the heating unit 3230 are provided side by side along the second direction 14. According to an embodiment, the cooling unit 3220 may be located closer to the transfer chamber 350 than the heating unit 3230.

The cooling unit 3220 has a cooling plate 3222. The cooling plate 3222 may have a substantially circular shape when viewed from above. A cooling member 3224 is provided inside the cooling plate 3222. According to an embodiment, the cooling member 3224 may be formed inside the cooling plate 3222 and may serve as a fluid channel through which a cooling fluid flows.

The heating unit 3230 has a heating plate 3232, a cover 3234, and a heater 3233. The heating plate 323 has a substantially circular shape when viewed from above. The heating plate 3232 has a larger diameter than the substrate W. The heating plate 3232 is equipped with the heater 3233. The heater 3233 may be implemented with a resistance heating element to which an electric current is applied. The heating plate 3232 has lift pins 3238 that are vertically movable along the third direction 16. The lift pins 3238 receive the substrate W from a transfer unit outside the heating unit 3230 and lay the substrate W down on the heating plate 3232, or raise the substrate W off the heating plate 3232 and transfer the substrate W to the transfer unit outside the heating unit 3230. According to an embodiment, three lift pins 3238 may be provided. The cover 3234 has a space therein, which is open at the bottom. The cover 3234 is located over the heating plate 3232 and is vertically moved by an actuator 3236. A space that the cover 3234 is moved to form together with the heating plate 3232 serves as a heating space in which the substrate W is heated.

The transfer plate 3240 has a substantially circular plate shape and has a diameter corresponding to that of the substrate W. The transfer plate 3240 has notches 3244 formed at the edge thereof. The notches 3244 may have a shape corresponding to the support protrusions 3543 formed on the hand 354 of the transfer robot 352 described above. Furthermore, as many notches 3244 as the support protrusions 3543 formed on the hand 354 are formed in positions corresponding to the support protrusions 3543. The substrate W is transferred between the hand 354 and the transfer plate 3240 when the vertical positions of the hand 354 and the transfer plate 3240 aligned with each other in the up/down direction are changed. The transfer plate 3240 may be mounted on a guide rail 3249 and may be moved between a first region 3212 and a second region 3214 along the guide rail 3249 by an actuator 3246. A plurality of guide grooves 3242 in a slit shape are formed in the transfer plate 3240. The guide grooves 3242 extend inward from the edge of the transfer plate 3240. The lengthwise direction of the guide grooves 3242 is parallel to the second direction 14, and the guide grooves 3242 are located to be spaced apart from each other along the first direction 12. The guide grooves 3242 prevent the transfer plate 3240 and lift pins 3238 from interfering with each other when the substrate W is transferred between the transfer plate 3240 and the heating unit 3230.

The substrate W is cooled in a state in which the transfer plate 3240 having the substrate W placed thereon is brought into contact with the cooling plate 3222. For efficient heat transfer between the cooling plate 3222 and the substrate W, the transfer plate 3240 is formed of a material having high heat conductivity. According to an embodiment, the transfer plate 3240 may be formed of a metallic material.

The heating units 3230 provided in some of the heat treatment chambers 3200 may improve adhesion of photoresist to the substrate W by supplying a gas while heating the substrate W. According to an embodiment, the gas may be a hexamethyldisilane gas.

Some of the liquid treatment chambers 360 may be stacked on each other. The liquid treatment chambers 360 are located on one side of the transfer chamber 350. The liquid treatment chambers 360 are arranged side by side along the first direction 12. Some of the liquid treatment chambers 360 are located adjacent to the index module 100. Hereinafter, these liquid treatment chambers 360 are referred to as front liquid treatment chambers 362. Other liquid treatment chambers 360 are located adjacent to the interface module 500. Hereinafter, these liquid treatment chambers 360 are referred to as rear liquid treatment chambers 364.

Each of the front liquid treatment chambers 362 applies a first liquid to the substrate W, and each of the rear liquid treatment chambers 364 applies a second liquid to the substrate W. The first liquid and the second liquid may be different types of liquids. According to an embodiment, the first liquid is an anti-reflection film, and the second liquid is photoresist. The photoresist may be applied to the substrate W coated with the anti-reflection film. Selectively, the first liquid may be photoresist, and the second liquid may be an anti-reflection film. In this case, the anti-reflection film may be applied to the substrate W coated with the photoresist. Selectively, the first liquid and the second liquid may be of the same type. Both the first liquid and the second liquid may be photoresist.

Figure 8:
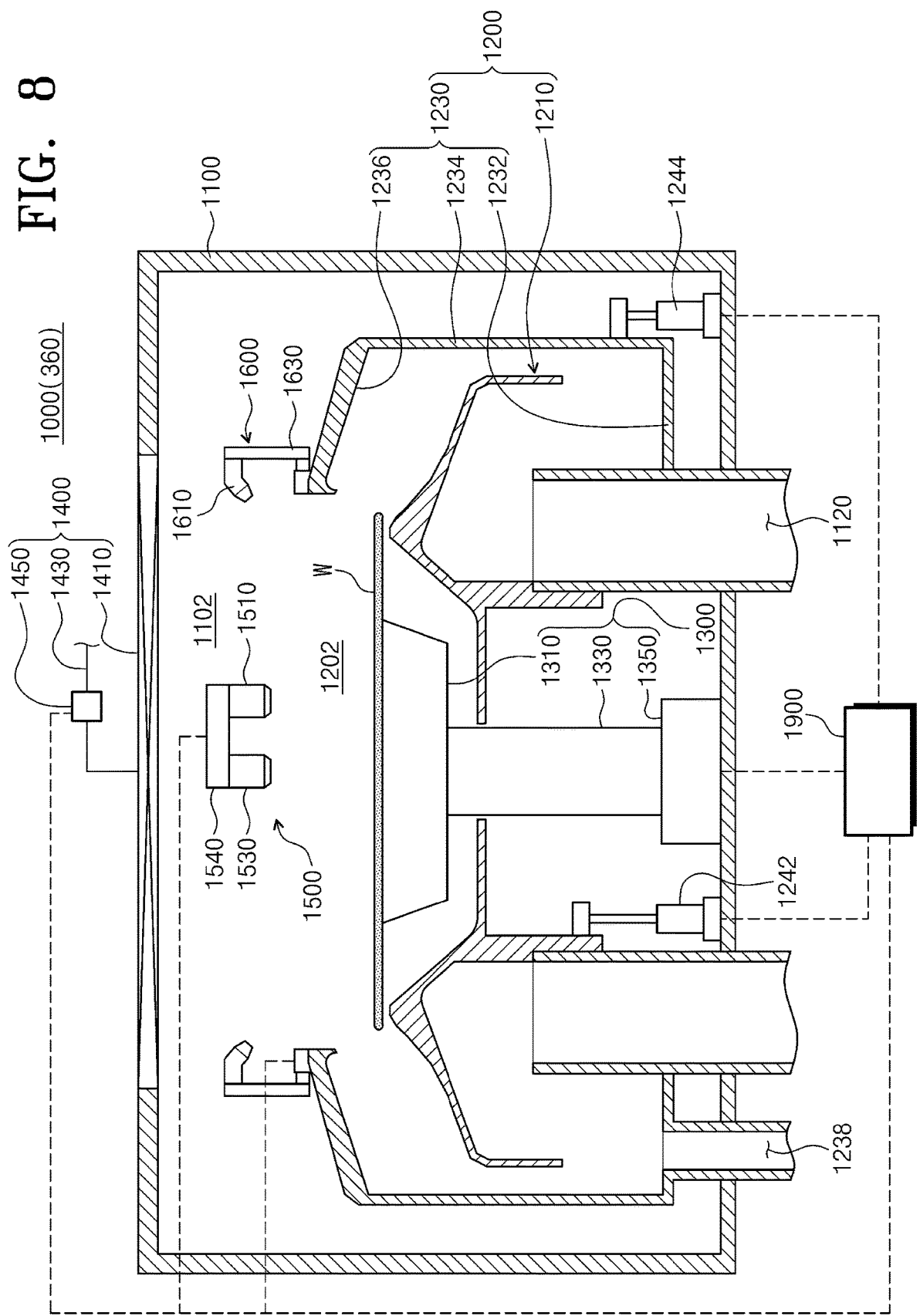
FIG. 8 is a schematic view illustrating one example of liquid treatment chambers of FIG. 4.
Figure 9:
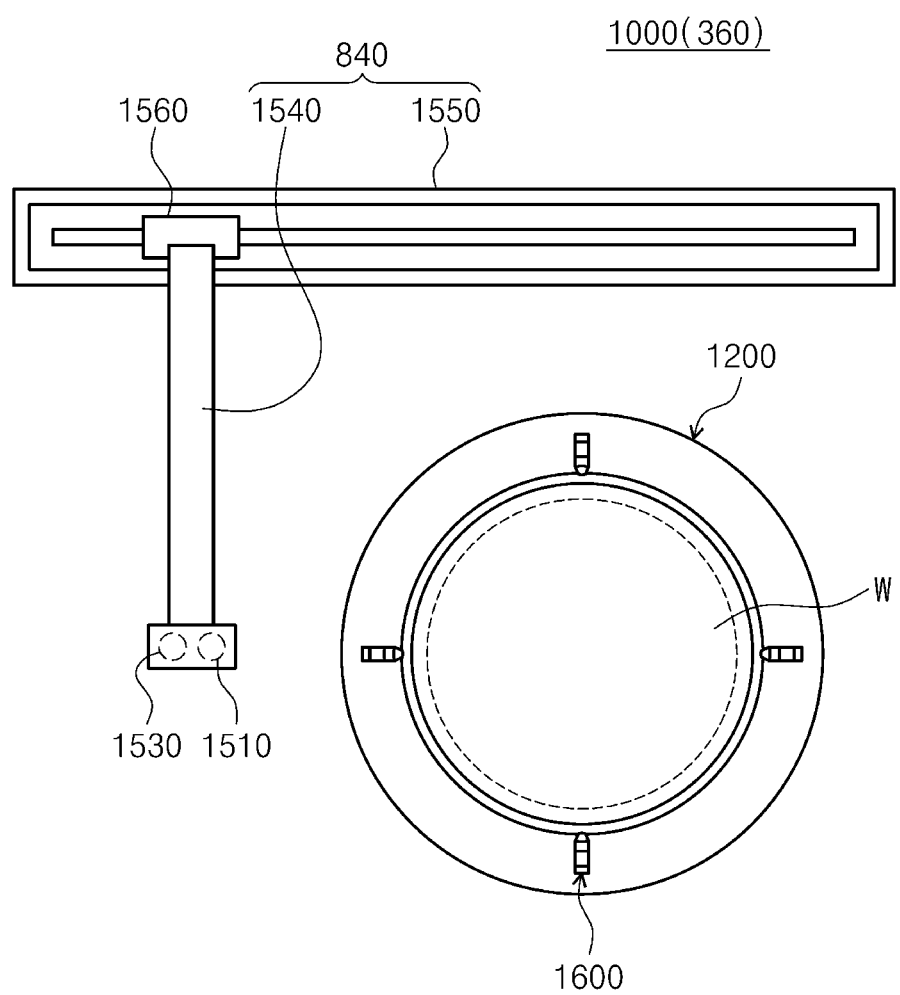
FIG. 9 is a plan view of the liquid treatment chamber of FIG. 8.

FIG. 8 is a schematic view illustrating one example of the liquid treatment chambers of FIG. 4, and FIG. 9 is a plan view of the liquid treatment chamber of FIG. 8. Referring to FIGS. 8 and 9, a substrate treating apparatus 1000 for treating a substrate W may be provided in the liquid treatment chamber 360. The substrate treating apparatus 1000 for performing liquid treatment on the substrate W may be provided in the liquid treatment chamber 360.

The substrate treating apparatus 1000 provided in the liquid treatment chamber 360 may include a housing 1100, a treatment vessel 1200, a support unit 1300, an air-flow supply unit 1400, a liquid supply unit 1500, a wetting unit 1600, and a controller 1900.

The housing 1100 may have an inner space 1102. The housing 1100 may have a rectangular container shape having the inner space 1102. An opening (not illustrated) may be formed in a sidewall of the housing 1100. The opening may function as an entrance/exit opening through which the substrate W enters or exits the inner space 1102. Furthermore, to selectively open or close the opening, a door (not illustrated) may be provided in a region adjacent to the opening. The door may close the opening to seal the inner space 1102 from the outside while a treating process is performed on the substrate W placed in the inner space 1102.

The treatment vessel 1200 may be disposed in the inner space 1102. The treatment vessel 1200 may have a treatment space 1202. That is, the treatment vessel 1200 may be a bowl having the treatment space 1202. Accordingly, the inner space 1102 may surround the treatment space 1202. The treatment vessel 1200 may have a cup shape that is open at the top. The treatment space 1202 of the treatment vessel 1200 may be a space in which the support unit 1300, which will be described below, supports and rotates the substrate W. The treatment space 1202 may be a space in which the liquid supply unit 1500 and the wetting unit 1600 supply treatment mediums to treat the substrate W.

The treatment vessel 1200 may include an inner cup 1210 and an outer cup 1230. The outer cup 1230 may surround the support unit 1300, and the inner cup 1210 may be located inside the outer cup 1230. The inner cup 1210 and the outer cup 1230 may each have an annular ring shape when viewed from above. A space between the inner cup 1210 and the outer cup 1230 may function as a recovery passage through which the treatment mediums introduced into the treatment space 1202 are recovered.

The inner cup 1210, when viewed from above, may have a shape that surrounds a rotary shaft 1330 of the support unit 1300 to be described below. For example, the inner cup 1210, when viewed from above, may have a circular plate shape that surrounds the rotary shaft 1330. When viewed from above, the inner cup 1210 may be located to overlap an exhaust port 1120 coupled to the housing 1100. The inner cup 1210 may have an inner part and an outer part. Upper surfaces of the inner part and the outer part may have different angles with respect to a virtual horizontal line. For example, the inner part, when viewed from above, may be located to overlap a support plate 1310 of the support unit 1300 to be described below. The inner part may be located to face the rotary shaft 1330. The upper surface of the inner part may be inclined upward away from the rotary shaft 1330, and the outer part may extend outward from the inner part. The upper surface of the outer part may be inclined downward away from the rotary shaft 1330. An upper end of the inner part may coincide with a lateral end portion of the substrate W in an up/down direction. According to an embodiment, the point where the inner part and the outer part meet each other may be located in a lower position than the upper end of the inner part. The point where the inner part and the outer part meet each other may be rounded. The outer part may be combined with the outer cup 1230 to form the recovery passage through which the treatment mediums, such as a treatment liquid and a wetting medium, are recovered.

The outer cup 1230 may have a cup shape that surrounds the support unit 1300 and the inner cup 1210. The outer cup 1230 may have a bottom portion 1232, a lateral portion 1234, and an inclined portion 1236. The bottom portion 1232 may have a circular plate shape having an empty space. A recovery line 1238 may be connected to the bottom portion 1232. The recovery line 1238 may be used to recover the treatment mediums supplied to the substrate W. The treatment mediums recovered by the recovery line 1238 may be reused by an external regeneration system. The lateral portion 1234 may have an annular ring shape that surrounds the support unit 1300. The lateral portion 1234 may extend from a lateral end of the bottom portion 1232 in a vertical direction. The lateral portion 1234 may extend upward from the bottom portion 1232.

The inclined portion 1236 may extend from an upper end of the lateral portion 1234 in a direction toward the central axis of the outer cup 1230. An inner surface of the inclined portion 1236 may be inclined upward so as to be close to the support unit 1300. The inclined portion 1236 may have a ring shape. While a treatment process is performed on the substrate W, an upper end of the inclined portion 1236 may be located in a higher position than the substrate W supported on the support unit 1300.

An inner lifting member 1242 and an outer lifting member 1244 may raise or lower the inner cup 1210 and the outer cup 1230, respectively. The inner lifting member 1242 and the outer lifting member 1244 may be coupled with the inner cup 1210 and the outer cup 1230 to raise or lower the inner cup 1210 and the outer cup 1230, respectively.

The support unit 1300 may support and rotate the substrate W. The support unit 1300 may be a chuck that supports and rotates the substrate W. The support unit 1300 may include the support plate 1310, the rotary shaft 1330, and a rotary actuator 1350. The support plate 1310 may have a seating surface on which the substrate W is seated. The support plate 1310 may have a circular shape when viewed from above. The support plate 1310, when viewed from above, may have a smaller diameter than the substrate W. Suction holes (not illustrated) may be formed in the support plate 1310, and the support plate 1310 may clamp the substrate W by vacuum pressure. Selectively, the support plate 1310 may include an electrostatic plate (not illustrated) and may clamp the substrate W by electrostatic attraction. Selectively, the support plate 1310 may include support pins that support the substrate W, and the support pins may make physical contact with the substrate W to clamp the substrate W.

The rotary shaft 1330 may be coupled with the support plate 1310. The rotary shaft 1330 may be coupled with a lower surface of the support plate 1310. The rotary shaft 1330 may be disposed such that the lengthwise direction thereof is parallel to the up/down direction. The rotary shaft 1330 may be rotated by power transmitted from the rotary actuator 1350. Accordingly, the rotary shaft 1330 may rotate the support plate 1310. The rotary actuator 1350 may vary the rotational speed of the rotary shaft 1330. The rotary actuator 1350 may be a motor that provides a driving force. However, without being limited thereto, the rotary actuator 1350 may be implemented with various well-known apparatuses that provide a driving force.

The air-flow supply unit 1400 may supply an air flow into the inner space 1102. The air-flow supply unit 1400 may supply a downward air flow into the inner space 1102. The air-flow supply unit 1400 may supply an air flow, the temperature and/or humidity of which is adjusted, into the inner space 1102. The air-flow supply unit 1400 may be installed in the housing 1100. The air-flow supply unit 1400 may be provided over the treatment vessel 1200 and the support unit 1300. The air-flow supply unit 1400 may include a fan 1410, an air-flow supply line 1430, and a filter 1450. The air-flow supply line 1430 may supply an outside air flow, the temperature and/or humidity of which is adjusted, into the inner space 1102. The filter 1450 may be disposed in-line with the air-flow supply line 1430 and may remove impurities contained in the outside air flow that flows in the air-flow supply line 1430. Furthermore, the fan 1410, when operated, may uniformly deliver the outside air flow supplied by the air-flow supply line 1430 into the inner space 1102.

The liquid supply unit 1500 may supply a treatment liquid PR to the substrate W supported on the support unit 1300. The treatment liquid PR supplied to the substrate W by the liquid supply unit 1500 may be a coating solution. For example, the coating solution may be a light-sensitive liquid such as photoresist. Furthermore, the liquid supply unit 1500 may supply a pre-wetting liquid to the substrate W supported on the support unit 1300. The pre-wetting liquid TH supplied to the substrate W by the liquid supply unit 1500 may be a liquid that can change a surface property of the substrate W. For example, the pre-wetting liquid TH may be thinner that can change the surface property of the substrate W to a hydrophobic property.

The liquid supply unit 1500 may include a pre-wetting nozzle 1510, a treatment liquid nozzle 1530, a first arm 1540, a first guide rail 1550, and a first actuator 1560.

The pre-wetting nozzle 1510 may supply the aforementioned pre-wetting liquid TH to the substrate W. The pre-wetting nozzle 1510 may supply the pre-wetting liquid TH to the substrate W in the manner of a stream. The pre-wetting nozzle 1510 may supply the aforementioned treatment liquid PR to the substrate W. The treatment liquid nozzle 1530 may be a coating solution nozzle that supplies a coating solution such as the aforementioned photoresist. The treatment liquid nozzle 1530 may supply the treatment liquid PR to the substrate W in the manner of a stream.

The first arm 1540 may support the pre-wetting nozzle 1510 and the treatment liquid nozzle 1530. The pre-wetting nozzle 1510 and the treatment liquid nozzle 1530 may be installed on one end portion of the first arm 1540. The pre-wetting nozzle 1510 and the treatment liquid nozzle 1530 may be installed on a lower surface of the one end portion of the first arm 1540. When viewed from above, the pre-wetting nozzle 1510 and the treatment liquid nozzle 1530 may be arranged in a direction parallel to the lengthwise direction of the first guide rail 1550 to be described below. An opposite end portion of the first arm 1540 may be coupled with the first actuator 1560. The first arm 1540 may be moved by the first actuator 1560 that moves the first arm 1540. Accordingly, the positions of the pre-wetting nozzle 1510 and the treatment liquid nozzle 1530 installed on the first arm 1540 may be changed. The first arm 1540 may be guided along the first guide rail 1550 on which the first actuator 1560 is installed. The first guide rail 1550 may be disposed such that the lengthwise direction thereof is parallel to a horizontal direction. For example, the first guide rail 1550 may be disposed such that the lengthwise direction thereof is parallel to the first direction 12. Selectively, the first arm 1540 may be coupled to a rotary shaft having a lengthwise direction parallel to the third direction 16. The rotary shaft may be rotated by an actuator. Accordingly, the positions of the pre-wetting nozzle 1510 and the treatment liquid nozzle 1530 installed on the first arm 1540 may be changed.

The wetting unit 1600 may spray a wetting medium M into the treatment space 1202 of the treatment vessel 1200. For example, the wetting unit 1600 may spray the wetting medium M into the treatment space 1202 in a direction toward an upper surface of the substrate W. Furthermore, the wetting unit 1600 may spray the wetting medium M to a region in the treatment space 1202 that faces the upper surface of the substrate W. For example, the wetting unit 1600 may spray the wetting medium M to a region over the substrate W in the treatment space 1202.

The wetting unit 1600 may be installed on the treatment vessel 1200 to spray the wetting medium M toward the substrate W supported on the support unit 1300. For example, the wetting unit 1600 may be installed on the treatment vessel 1200 to spray the wetting medium M toward an edge region of the substrate W supported on the support unit 1300. Furthermore, the wetting unit 1600 may be installed on the inclined portion 1236 of the treatment vessel 1200. For example, the wetting unit 1600 may be installed on an outer surface of the inclined portion 1236 of the treatment vessel 1200.

The wetting unit 1600 may include a wetting medium nozzle 1610 and a support part 1630. The support part 1630 may be installed on the treatment vessel 1200. The support part 1630 may be installed on the outer cup 1230 of the treatment vessel 1200. The support part 1630 may be installed on an outer surface of the outer cup 1230. The support part 1630 may be installed on the inclined portion 1236 of the outer cup 1230. The support part 1630 may be installed at a distal end of the inclined portion 1236. The wetting medium nozzle 1610 may be installed on the treatment vessel 1200 through the support part 1630. Furthermore, at least one wetting unit 1600 may be provided. For example, a plurality of wetting units 1600 may be provided. The plurality of wetting units 1600 may be installed on the treatment vessel 1200. In the case where the plurality of wetting units 1600 are provided, the wetting units 1600, when viewed from above, may be installed on the treatment vessel 1200 so as to be spaced apart from each other at predetermined intervals. For example, four wetting units 1600 may be provided.

The wetting medium nozzle 1610 may be configured to spray the wetting medium M into the treatment space 1202 of the treatment vessel 1200. The wetting medium nozzle 1610 may be configured to spray the wetting medium M into the treatment space 1202 in a direction toward the substrate W. The wetting medium nozzle 1610 may be configured to spray the wetting medium M into the treatment space 1202 in a direction toward the edge region of the substrate W. The wetting medium nozzle 1610 may be configured to be inclined downward such that a dispensing end faces toward the substrate W. The wetting medium nozzle 1610 may be configured to be inclined downward such that the dispensing end faces toward the edge region of the substrate W. Accordingly, the wetting medium M may be sprayed to the edge region of the substrate W and/or a region in the treatment space 1202 that faces the edge region of the substrate W.

Furthermore, the wetting medium nozzle 1610 may be configured to spray the wetting medium M in the form of fine particles. For example, the wetting medium nozzle 1610 may be configured to spray the wetting medium M in the form of mist.

The wetting medium M sprayed by the wetting unit 1600 may be a medium that helps diffusion of the treatment liquid PR on the substrate W. The wetting medium M may be a medium that suppresses evaporation of a solvent contained a liquid film formed on the substrate W. The wetting medium M may be a medium that adjusts the degree of evaporation of a solvent contained in a coating solution supplied to the substrate W. For example, the wetting medium M may be thinner.

The controller 1900 may control the substrate treating apparatus 10. For example, the controller 1900 may control the substrate treating apparatus 1000 provided in the liquid treatment chamber 360. The controller 1900 may control the substrate treating apparatus 1000 to perform a liquid treatment process on the substrate W in the liquid treatment chamber 360. The controller 1900 may control the substrate treating apparatus 1000 to perform a coating process of forming a liquid film on the substrate W in the liquid treatment chamber 360. For example, the controller 1900 may control the treatment vessel 1200, the support unit 1300, the air-flow supply unit 1400, the liquid supply unit 1500, and the wetting unit 1600. For example, the controller 1900 may control the support unit 1300, the liquid supply unit 1500, and the wetting unit 1600 such that the support unit 1300 supports and rotates the substrate W, the liquid supply unit 1500 supplies the pre-wetting liquid TM or the treatment liquid PR to the substrate W, and the wetting unit 1600 sprays the wetting medium M into the treatment space 1202. Furthermore, the controller 1900 may control the substrate treating apparatus 10 to perform a substrate treating method to be described below. In addition, the controller 1900 may control the substrate treating apparatus 1000 to perform a liquid film forming method to be described below.

Hereinafter, a substrate treating method according to an embodiment of the inventive concept will be described in detail. The substrate treating method according to the embodiment of the inventive concept may be a method of forming a liquid film on a substrate W by supplying the treatment liquid PR to the substrate W. However, without being limited thereto, the substrate treating method according to the embodiment of the inventive concept may be identically or similarly applied to various processes in which liquid treatment for the substrate W is required.

Figure 10:
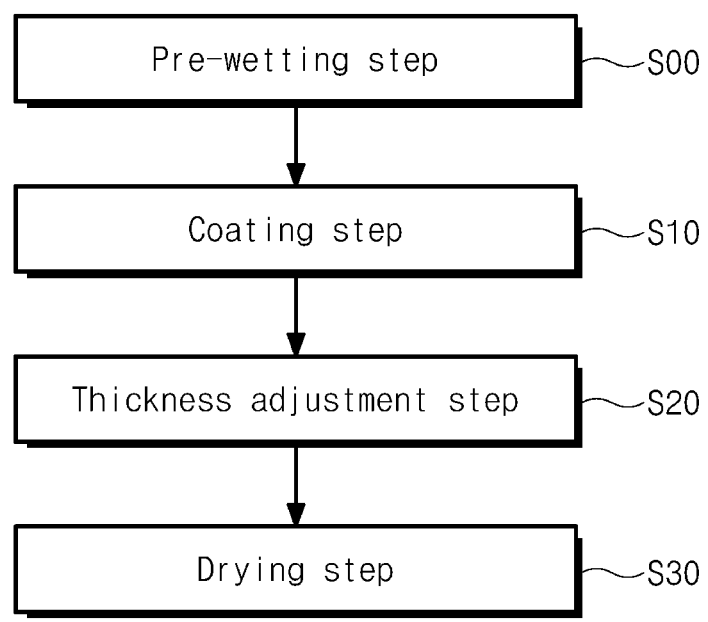
FIG. 10 is a flowchart illustrating a substrate treating method according to an embodiment of the inventive concept.
Figure 11:
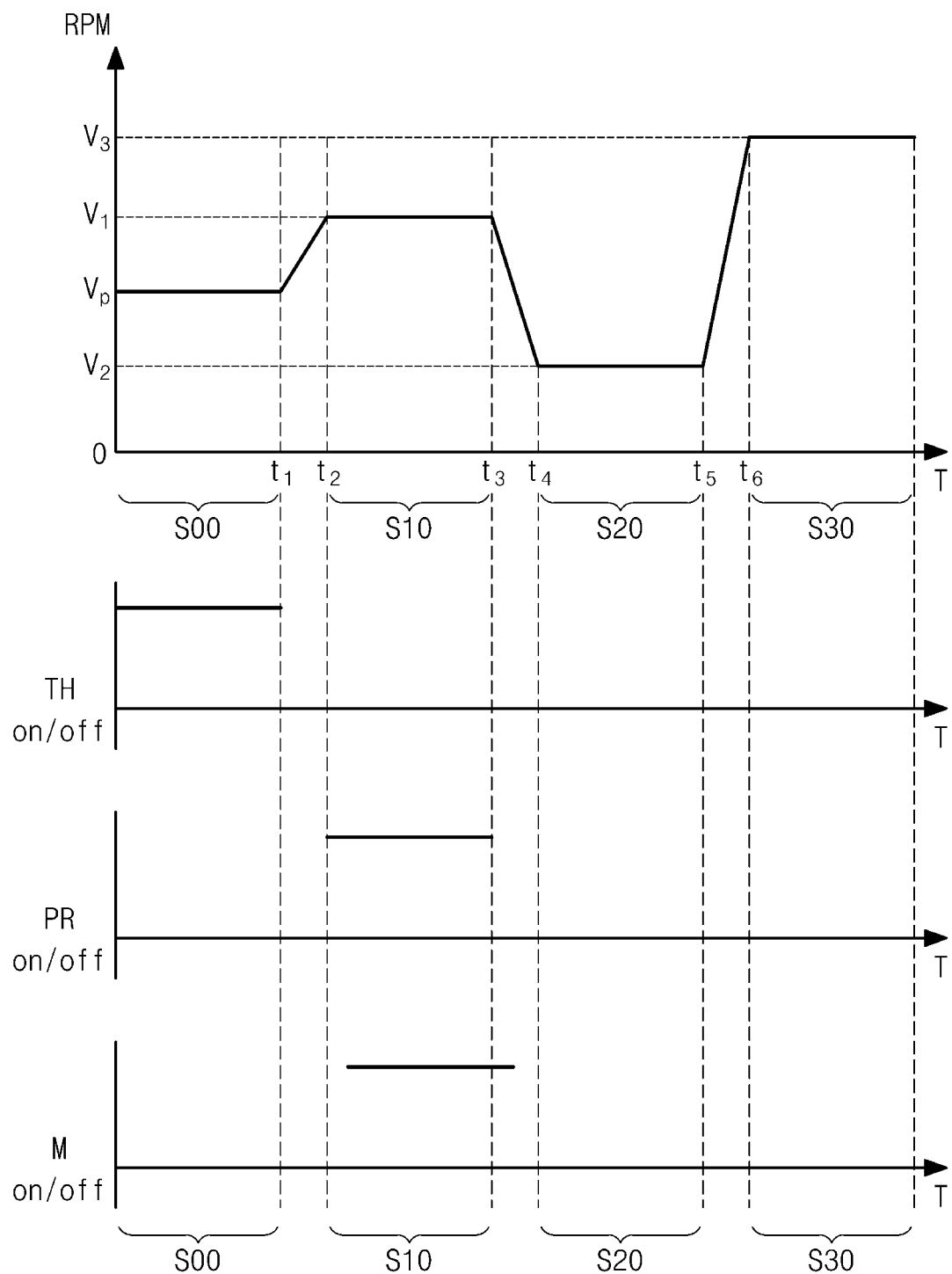
FIG. 11 is a view illustrating an RPM change of a substrate and time to supply treatment mediums to the substrate in a process of forming a liquid film on the substrate by the substrate treating method of FIG. 10.

FIG. 10 is a flowchart illustrating the substrate treating method according to the embodiment of the inventive concept, and FIG. 11 is a view illustrating an RPM change of a substrate and time to supply treatment mediums to the substrate in a process of forming a liquid film on the substrate by the substrate treating method of FIG. 10.

Referring to FIGS. 10 and 11, the substrate treating method according to the embodiment of the inventive concept may include a pre-wetting step S00, a coating step S10, a thickness adjustment step S20, and a drying step S30.

Figure 12:
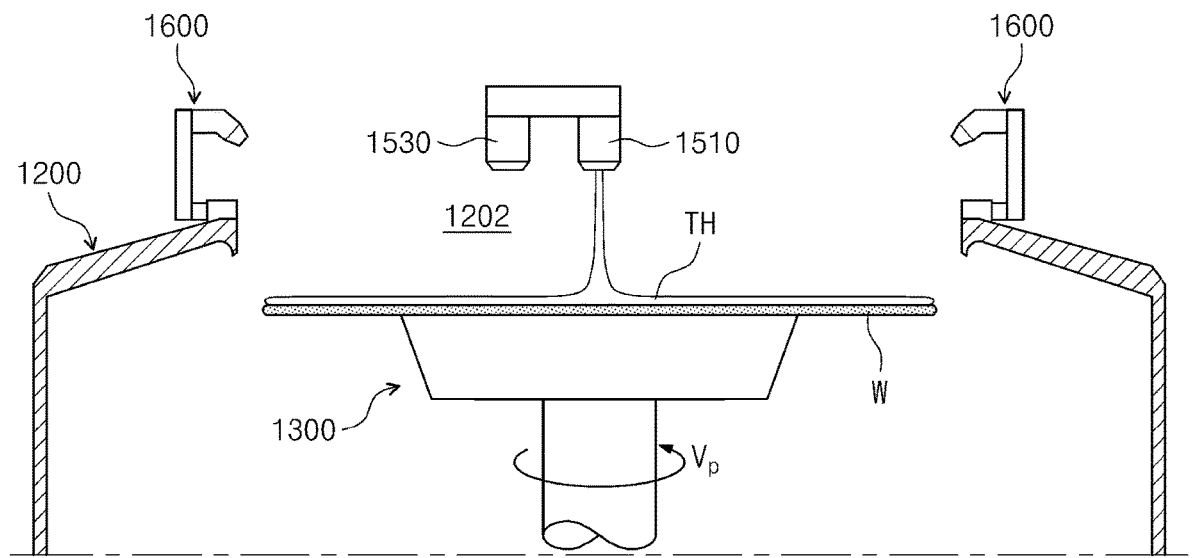
FIG. 12 is a view illustrating a state in which a substrate treating apparatus provided in the liquid treatment chamber of FIG. 8 performs a pre-wetting step of FIG. 10.

The pre-wetting step S00 may be a step of changing a surface of the substrate W into a wet state. In the pre-wetting step S00, the pre-wetting nozzle 1510 may supply the pre-wetting liquid TH to the substrate W. In the pre-wetting step S00, the substrate W may be rotated at free-speed Vp, and the pre-wetting nozzle 1510 may supply the pre-wetting liquid TH to a central region of the rotating substrate W (FIG. 12). In the pre-wetting step S00, the pre-wetting nozzle 1510 may supply the pre-wetting liquid TH to the central region of the rotating substrate W in the manner of a stream. FIG. 11 illustrates an example that the free-speed Vp, which is the rotating speed of the substrate W in the pre-wetting step S00, is lower than first speed V1 that is a rotating speed of the substrate W in the coating step S10. However, without being limited thereto, the free speed Vp may be changed to various speeds.

Figure 13:
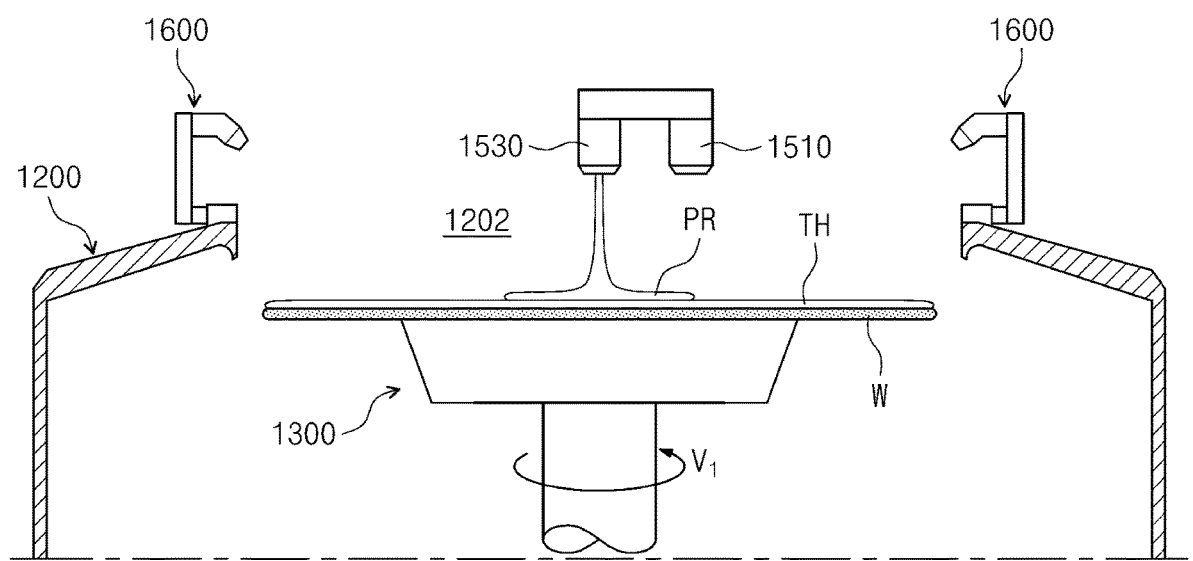
FIGS. 13 to 15 are views illustrating states in which the substrate treating apparatus provided in the liquid treatment chamber of FIG. 8 performs a coating step of FIG. 10.

The coating step (or, the first step) S10 may be a step of forming a liquid film on the substrate W by supplying the treatment liquid PR to the substrate W. In the coating step S10, the treatment liquid nozzle 1530 may supply the treatment liquid PR to the central region of the substrate W (FIG. 13). While the treatment liquid nozzle 1530 supplies the treatment liquid PR to the substrate W, the substrate W may be rotated at the first speed V1. The treatment liquid PR supplied to the central region of the rotating substrate W may be spread from the central region of the substrate W to an edge region of the substrate W by a centrifugal force. When the treatment liquid PR supplied by the treatment liquid nozzle 1530 has a high viscosity (e.g., 300 cP or more), the treatment liquid PR may not be appropriately spread to the edge region of the substrate W.

Figure 14:
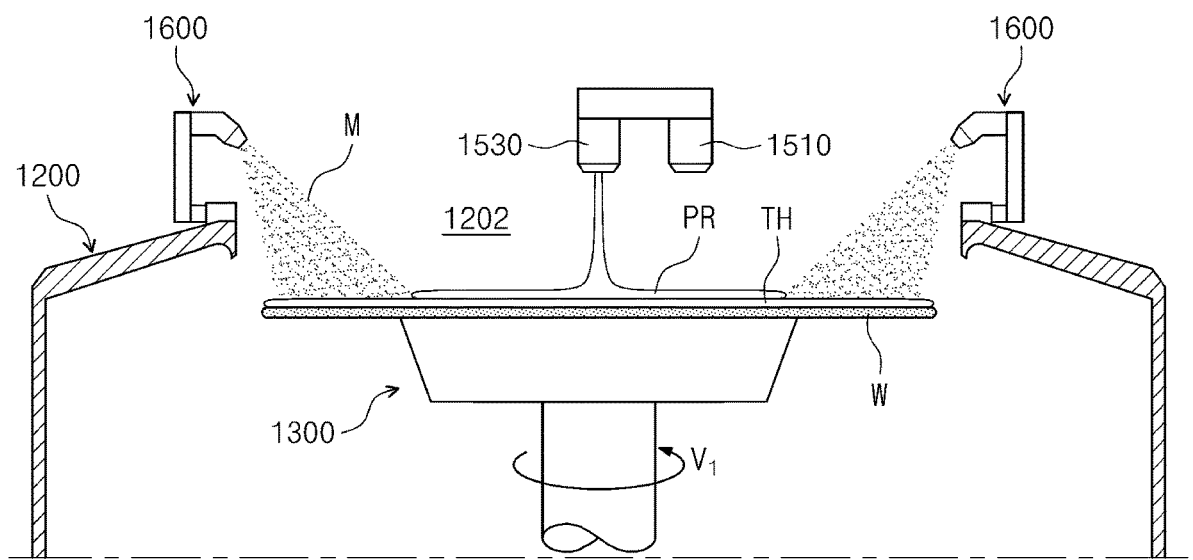

To solve this problem, in the substrate treating method according to the embodiment of the inventive concept, the wetting unit 1600 may spray the wetting medium M into the treatment space 1202 of the treatment vessel 1200 (FIG. 14). The time during which the wetting medium M is sprayed and the time during which the treatment liquid PR is supplied may at least partially overlap each other. Furthermore, the position where the wetting medium M is sprayed to the substrate W may be farther away from the center of the substrate W than the position where the treatment liquid PR is supplied to the substrate W. For example, the wetting unit 1600 may spray the wetting medium M into the treatment space 1202 in a direction toward the edge region of the substrate W. Due to the spray of the wetting medium M by the wetting unit 1600, the concentration per unit volume of the wetting medium M may vary depending on regions of the substrate W viewed from above. For example, the concentration per unit volume of the wetting medium M sprayed into the treatment space 1202 may be higher in the edge region of the substrate W than in the central region of the substrate W viewed from above.

In the substrate treating method according to the embodiment of the inventive concept, the wetting unit 1600 may spray the wetting medium M into the treatment space 1202 in the form of fine particles (e.g., mist) in the direction toward the edge region of the substrate W. The wetting unit 1600 may spray the wetting medium M from when the treatment liquid PR supplied to the substrate W reaches the edge region of the substrate W. For example, the wetting unit 1600 may spray the wetting medium M after the supply of the treatment liquid PR starts and set time passes. For example, time to start spraying the wetting medium M may be later than time to start supplying the treatment liquid PR.

Figure 15:
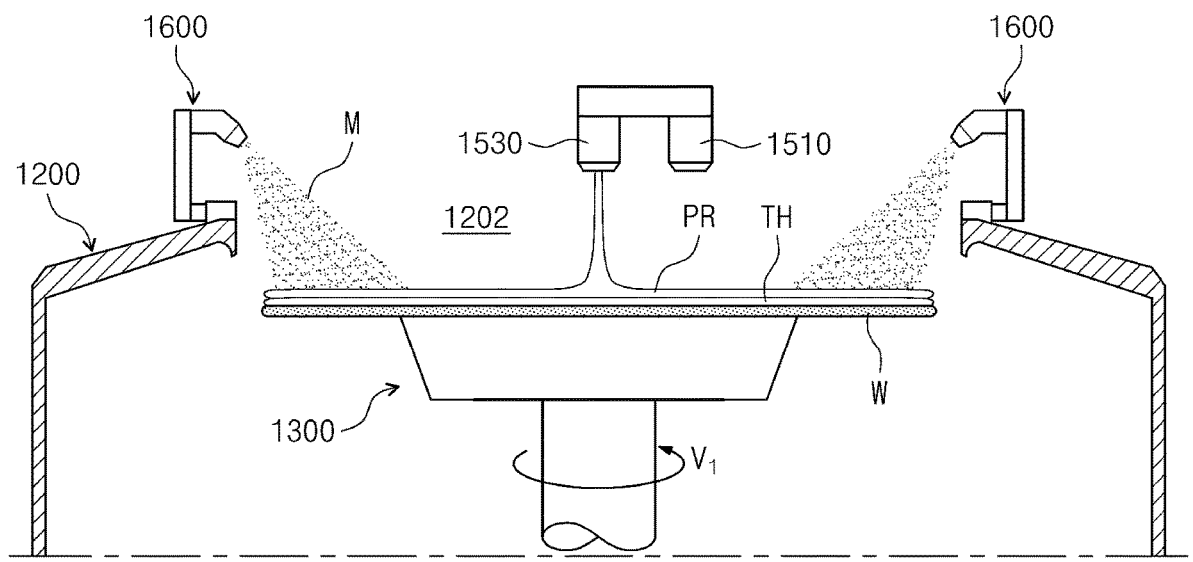

Alternatively, the wetting unit 1600 may spray the wetting medium M, based on a sensing signal generated by a sensor (not illustrated) that is provided in the substrate treating apparatus 1000 and that senses whether the treatment liquid PR reaches the edge region of the substrate W. The wetting medium M may be continually sprayed from when the treatment liquid PR reaches the edge region of the substrate W (FIG. 15). In other words, time to stop spraying the wetting medium M may be later than time to stop supplying the treatment liquid PR. That is, the wetting medium M may be further sprayed for a set period of time after the supply of the treatment liquid PR is stopped.

The wetting medium M may adjust the degree of evaporation of a solvent contained in the liquid film formed by the treatment liquid PR. For example, the wetting medium M may be provided as a medium dissolving the treatment liquid PR such as photoresist, which is an organic material, and may make the treatment liquid PR wet. The wetting medium M may adjust the degree of evaporation of the solvent contained in the liquid film formed by the treatment liquid PR. For example, the wetting medium M may suppress evaporation of the solvent contained in the liquid film formed by the treatment liquid PR. The solvent contained in the treatment liquid PR may promote adhesion of the treatment liquid PR with the substrate W, and in the substrate treating method according to the embodiment of the inventive concept, the wetting medium M may be sprayed in the coating step S10 to allow the solvent contained in the treatment liquid PR to exist in the treatment liquid PR without being evaporated, thereby minimizing loss of the adhesion of the treatment liquid PR with the substrate W.

Accordingly, uniformity (e.g., thickness uniformity) of the liquid film formed on the substrate W may be ensured, and problems of tearing and poor coating in the liquid film due to inappropriate diffusion of the treatment liquid PR may be minimized.

Furthermore, when the wetting medium M is sprayed to the edge region of the substrate W in the manner of a stream, a liquid film formed by the wetting medium M may collide with the liquid film formed by the treatment liquid PR and may hamper uniform coating of the treatment liquid PR. However, the substrate treating method according to the embodiment of the inventive concept may spray the wetting medium M in the form of mist, thereby minimizing disadvantage due to the film collision described above. In addition, by spraying the wetting medium M into the treatment space 1202 in the form of mist, the substrate treating method according to the embodiment of the inventive concept may change the atmosphere in the treatment space 1202 to an atmosphere in which the treatment liquid PR is easily diffused, thereby more efficiently ensuring liquid film uniformity and minimizing problems such as tearing and/or poor coating.

Referring again to FIGS. 10 and 11, in the thickness adjustment step (or, the second step) S20, the thickness of the liquid film formed by the treatment liquid PR supplied to the substrate W may be adjusted. In the thickness adjustment step S20, the supply of the treatment liquid PR may be stopped, and the substrate W may be rotated at second speed V2. The second speed V2 may be lower than the first speed V1. Accordingly, in the thickness adjustment step S20, the liquid film may be moved in a direction from the edge region of the substrate W toward the central region of the substrate W.

The drying step (or, the third step) S30 may be a step of drying the liquid film formed on the substrate W. In the drying step S30, the substrate W may be rotated at third speed V3. The third speed V3 may be higher than the first speed V1 and/or the second speed V2. The third speed V3 may be varied while the drying step S30 is performed.

Although it has been exemplified that the dispensing end of the wetting medium nozzle 1610 faces toward the edge region of the substrate W, the inventive concept is not limited thereto. For example, the wetting medium nozzle 1610 may be configured to adjust a spray region of the wetting medium M sprayed toward the substrate W supported on the support unit 1300. In this case, the wetting medium nozzle 1610 may selectively spray the wetting medium M to the central region of the substrate W or the edge region of the substrate W. The adjustment of the spray region may be performed while the treatment liquid PR is supplied to the substrate W.

Figure 16:
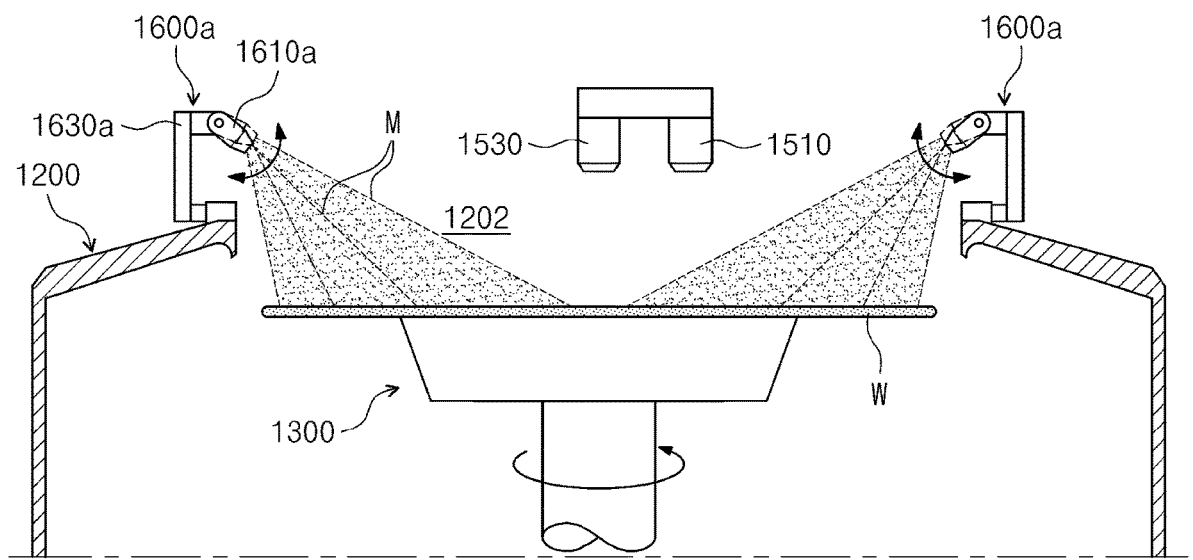
FIGS. 16 to 18 are views illustrating wetting units according to embodiments of the inventive concept.

As illustrated in FIG. 16, a dispensing end of a wetting medium nozzle 1610a coupled with a support part 1630a may be provided to be rotatable and may change a spray angle. The wetting unit 1600a may selectively spray the wetting medium M to the central region of the substrate W or the edge region of the substrate W.

Figure 17:
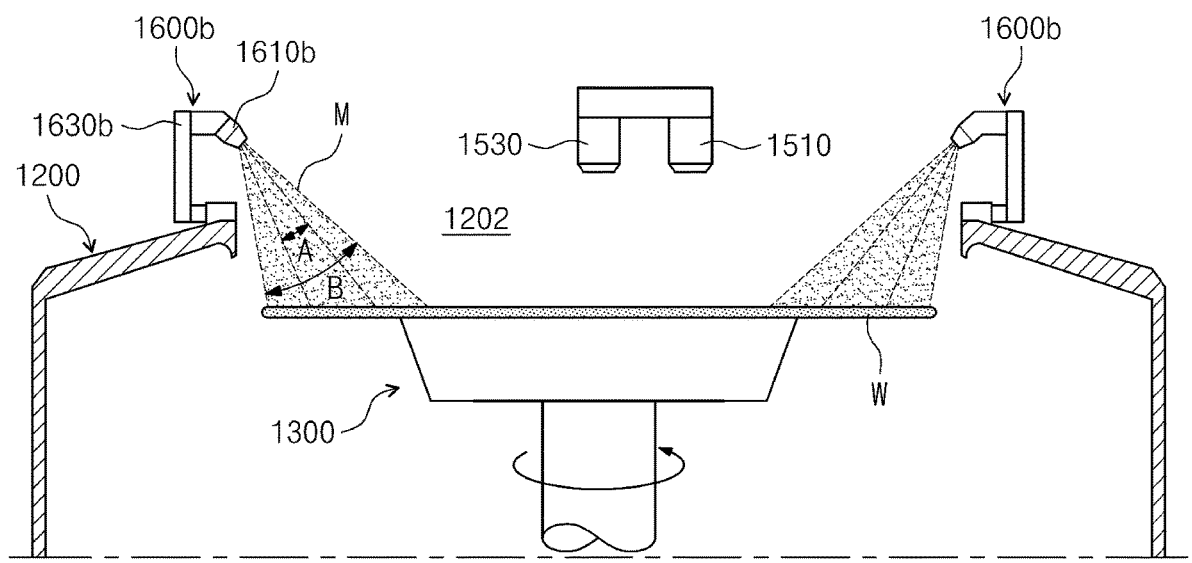

As illustrated in FIG. 17, a wetting medium nozzle 1610b coupled with a support part 1630b may be configured to selectively vary a spray range of the wetting medium M from "A" to "B" or from "B" to "A". Furthermore, the embodiments of the inventive concept illustrated in FIGS. 16 and 17 may be combined with each other.

Figure 18:
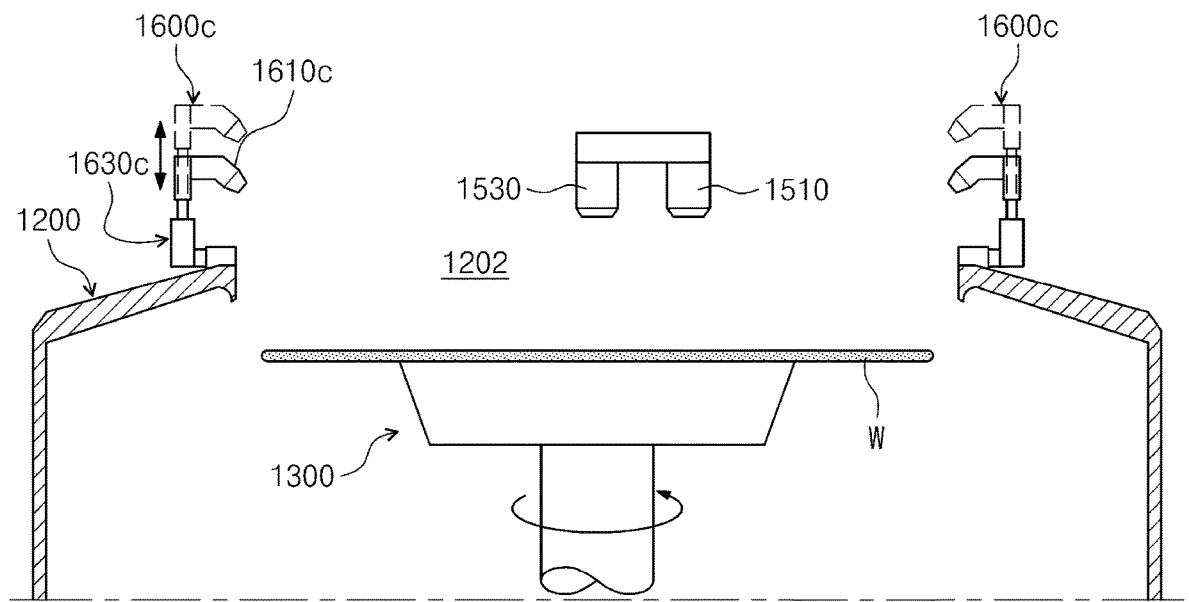

Although it has been exemplified that the wetting medium nozzle 1610 is fixedly coupled to the treatment vessel 1200 by the support part 1630, the inventive concept is not limited thereto. For example, as illustrated in FIG. 18, a support part 1630c may be configured to raise or lower a wetting medium nozzle 1610c in an up/down direction. A wetting unit 1600c may selectively spray the wetting medium M to the central region of the substrate W or the edge region of the substrate W. Furthermore, the embodiment of the inventive concept illustrated in FIG. 18 and the embodiments of the inventive concept illustrated in FIGS. 16 and 17 may be combined with each other.

Figure 19:
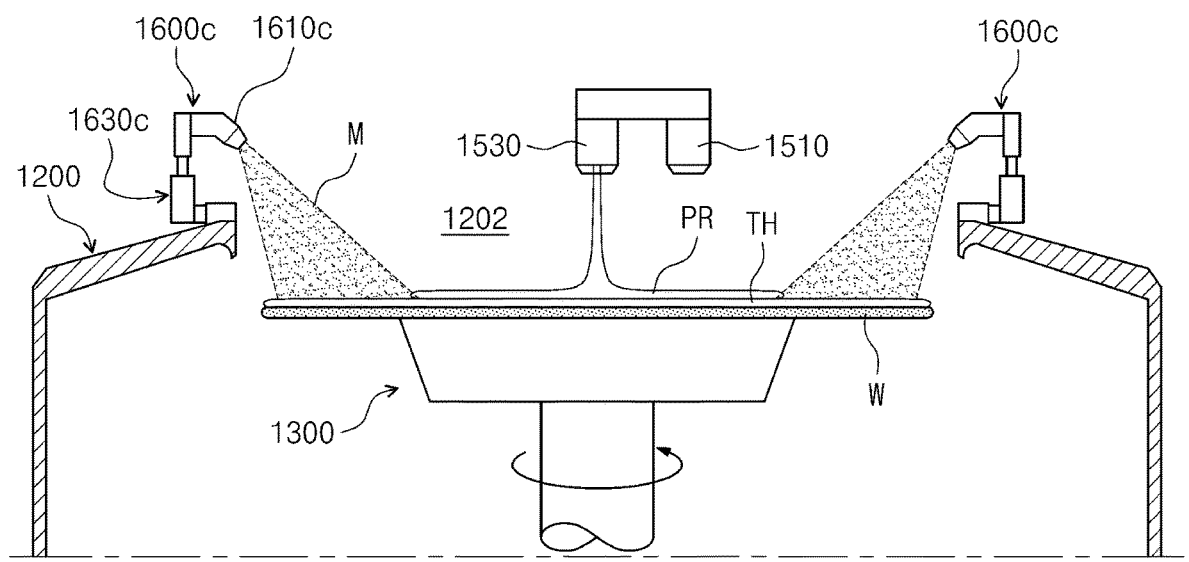
FIGS. 19 and 20 are views illustrating a wetting medium spray method according to an embodiment of the inventive concept.
Figure 20:
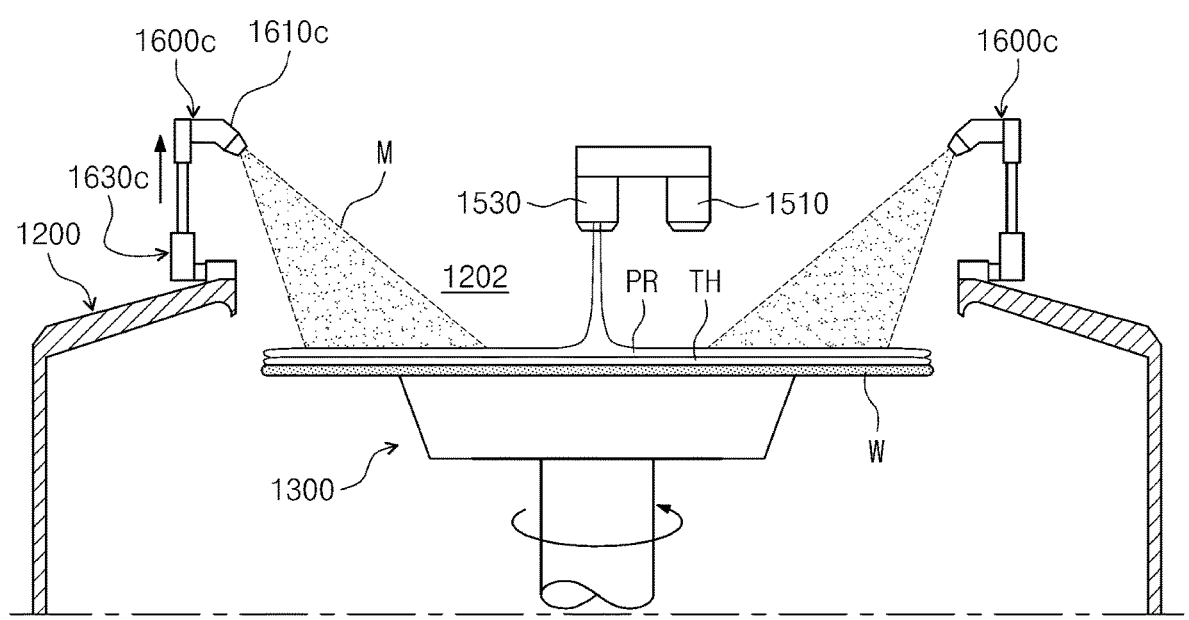

FIGS. 19 and 20 are views illustrating a wetting medium spray method according to an embodiment of the inventive concept. Referring to FIGS. 19 and 20, the wetting unit 1600c may spray the wetting medium M such that the concentration per unit volume of the wetting medium M varies depending on regions of the substrate W viewed from above. For example, when the wetting unit 1600c sprays the wetting medium M to the edge region of the substrate W viewed from above, the wetting unit 1600c may spray the wetting medium M such that the concentration per unit volume of the wetting medium M is equal to a first concentration. Furthermore, when the wetting unit 1600c sprays the wetting medium M to the central region of the substrate W viewed from above, the wetting unit 1600c may spray the wetting medium M such that the concentration per unit volume of the wetting medium M is equal to a second concentration. The second concentration may be lower than the first concentration.

Figure 21:
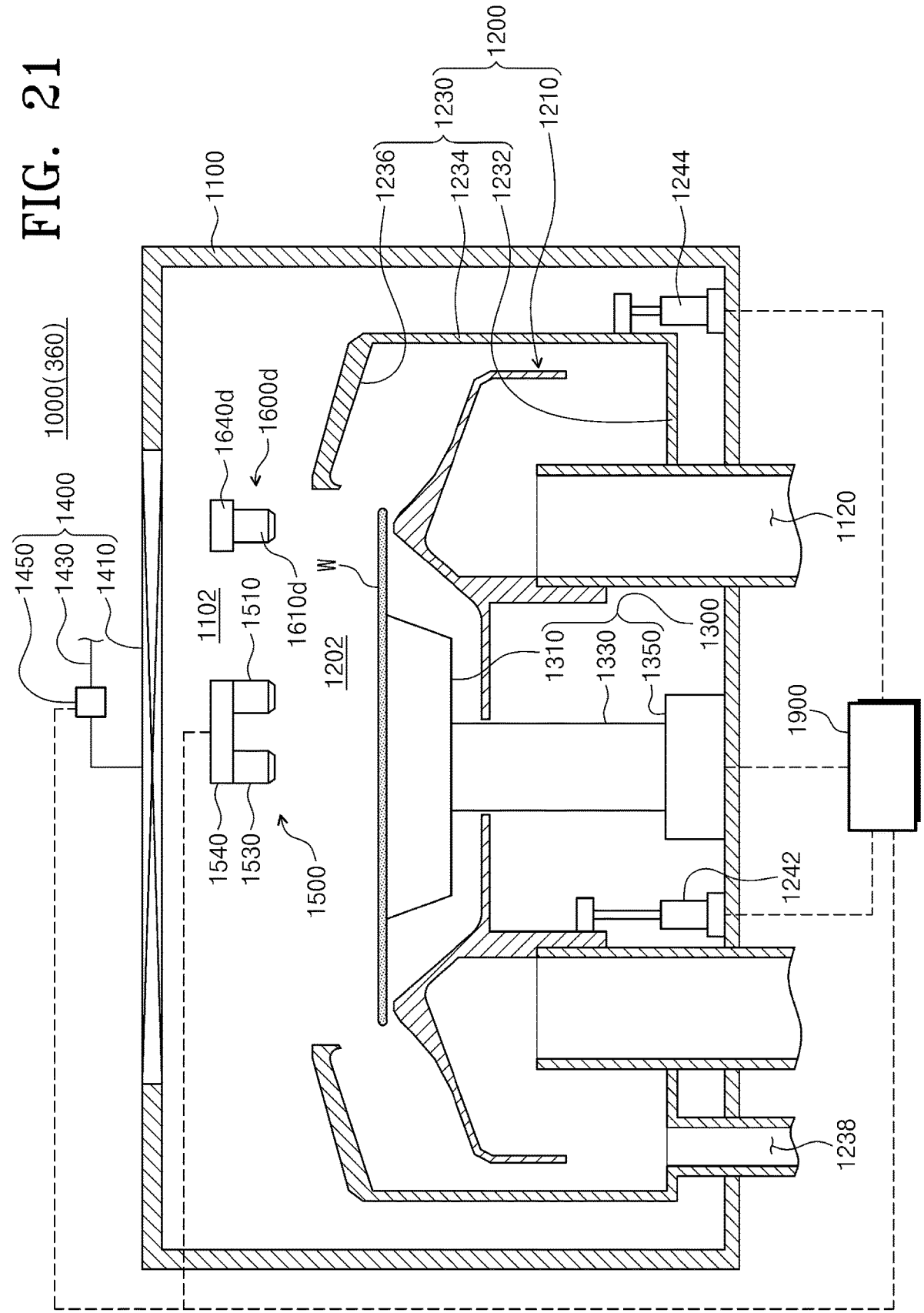
FIG. 21 is a view illustrating a substrate treating apparatus according to another embodiment of the inventive concept.
Figure 22:
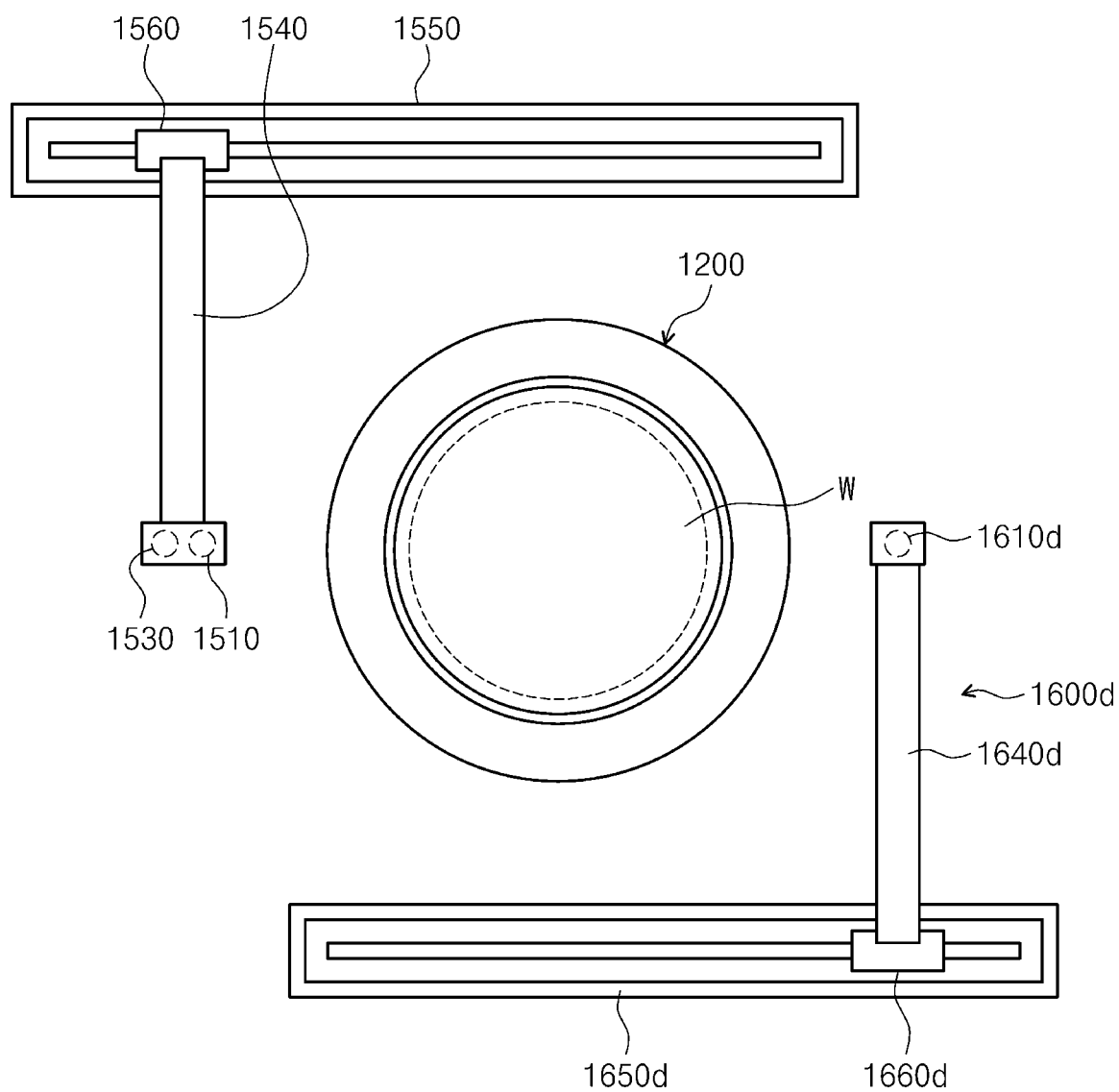
FIG. 22 is a plan view of the substrate treating apparatus of FIG. 21.

Although it has been exemplified that the wetting unit 1600 is installed on the treatment vessel 1200, the inventive concept is not limited thereto. For example, as illustrated in FIGS. 21 and 22, a wetting unit 1600d may include a wetting medium nozzle 1610d, a second arm 1640d, a second guide rail 1650d, and a second actuator 1660d.

The second arm 1640d may support the wetting medium nozzle 1610d. The wetting medium nozzle 1610d may be installed on one end portion of the second arm 1640d. The wetting medium nozzle 1610d may be installed on a lower surface of the one end portion of the second arm 1640d. When viewed from above, an opposite end portion of the second arm 1640d may be coupled with the second actuator 1660d. The second arm 1640d may be moved by the second actuator 1660d that moves the second arm 1640d. Accordingly, the position of the wetting medium nozzle 1610d installed on the second arm 1640d may be changed. The second arm 1640d may be guided along the second guide rail 1650d on which the second actuator 1660d is installed. The second guide rail 1650d may be disposed such that the lengthwise direction thereof is parallel to a horizontal direction. Selectively, the second arm 1640d may be coupled to a rotary shaft having a lengthwise direction parallel to the third direction 16. The rotary shaft may be rotated by an actuator. Accordingly, the position of the wetting medium nozzle 1610d installed on the second arm 1640d may be changed. Furthermore, the wetting unit 1600d and the liquid supply unit 1500 may be driven independently of each other.

Figure 23:
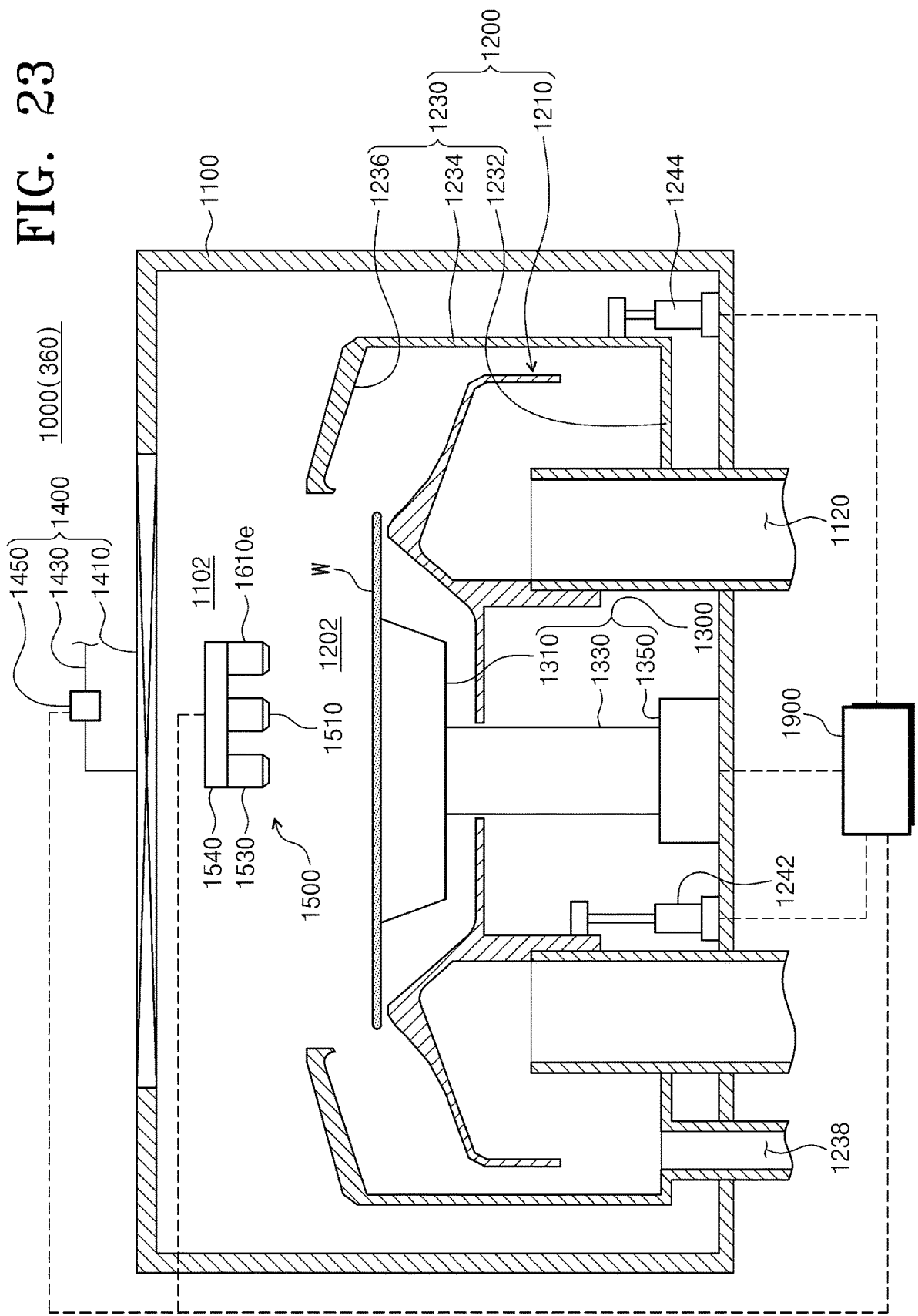
FIG. 23 is a view illustrating a substrate treating apparatus according to another embodiment of the inventive concept.

Although it has been exemplified that the wetting unit 1600 is installed on the treatment vessel 1200, the inventive concept is not limited thereto. For example, as illustrated in FIG. 23, a wetting medium nozzle 1610e of a wetting unit may be installed on the liquid supply unit 1500. For example, the wetting medium nozzle 1610e may be installed on a lower surface of the first arm 1540 included in the liquid supply unit 1500.

Figure 24:
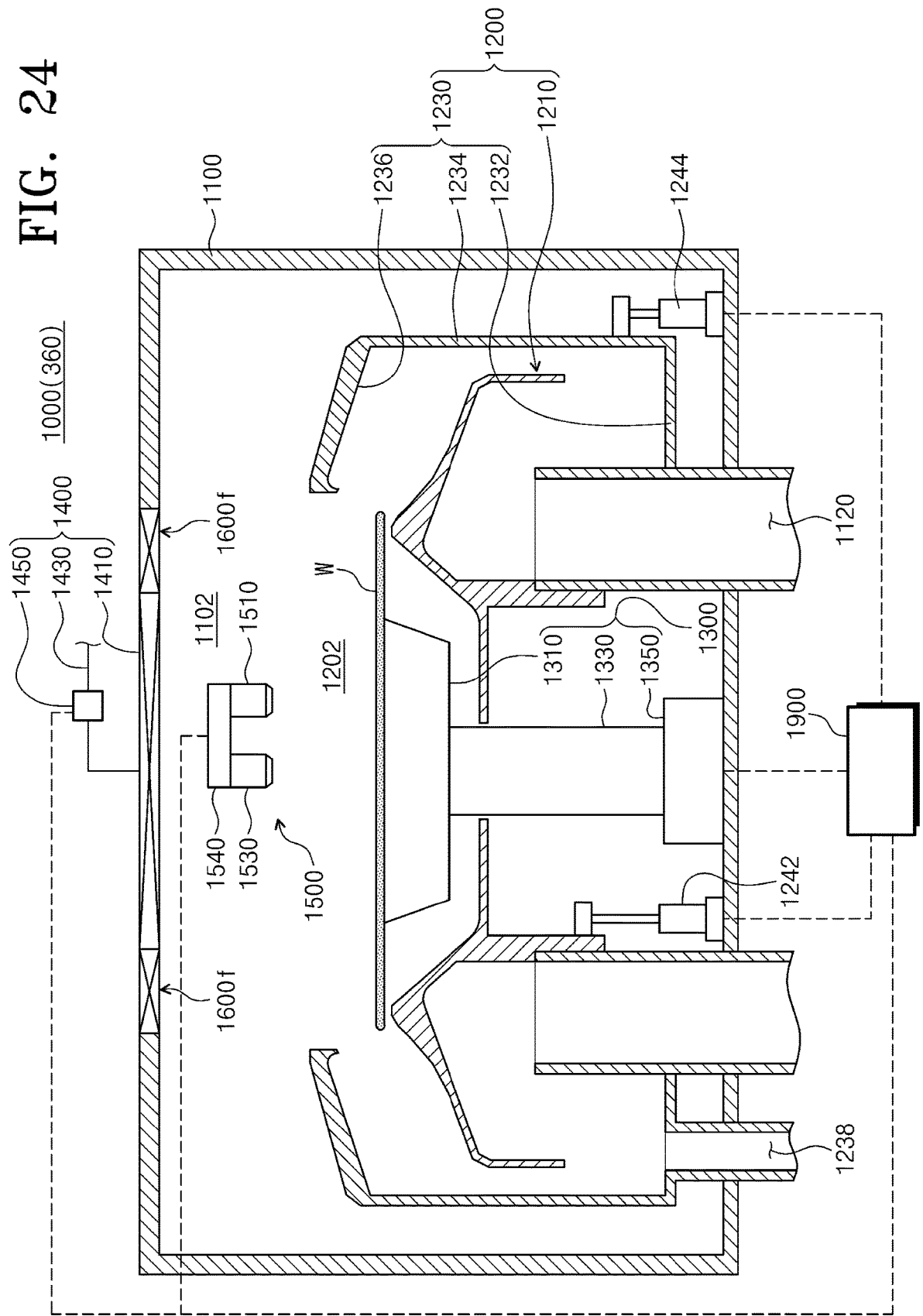
FIG. 24 is a view illustrating a substrate treating apparatus according to another embodiment of the inventive concept.

Although it has been exemplified that the wetting unit 1600 is installed on the treatment vessel 1200, the inventive concept is not limited thereto. For example, as illustrated in FIG. 24, a wetting unit 1600f may be installed in the air-flow supply unit 1400. The fan 1410 of the air-flow supply unit

1400 may be installed in a region corresponding to the central region of the substrate W supported on the support unit 1300, and the wetting unit 1600ƒ may be installed in a region corresponding to the edge region of the substrate W supported on the support unit 1300. Furthermore, when the wetting unit 1600ƒ is installed in the air-flow supply unit 1400, the wetting unit 1600ƒ may have a structure that sprays the wetting medium M and an air flow, the temperature and/or humidity of which is adjusted. For example, the wetting unit 1600ƒ may be configured to mix and supply the wetting medium M and an air flow.

Figure 25:
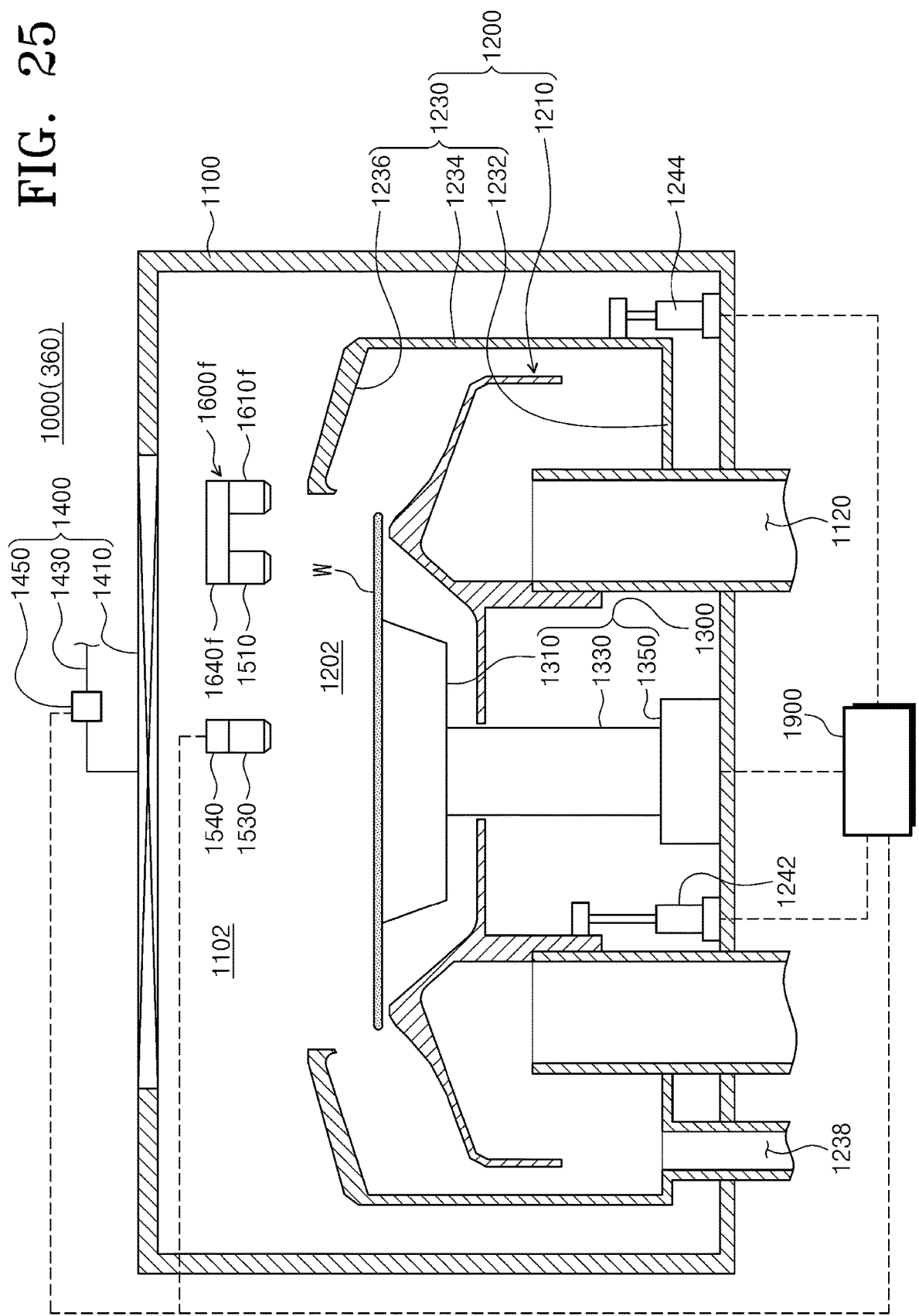
FIG. 25 is a view illustrating a substrate treating apparatus according to another embodiment of the inventive concept.

Although it has been exemplified that the wetting unit 1600 is installed on the treatment vessel 1200, the inventive concept is not limited thereto. For example, as illustrated in FIG. 25, the treatment liquid nozzle 1530 may be installed on the first arm 1540 and may be supported by the first arm 1540, and the pre-wetting nozzle 1510 and a wetting nozzle 1610ƒ may be installed on a second arm 1640ƒ and may be supported by the second arm 1640ƒ. The pre-wetting nozzle 1510 may be configured to supply the pre-wetting liquid TH in the manner of a stream, and the wetting nozzle 1610ƒ may be configured to spray the wetting medium M in the form of mist. Furthermore, the first arm 1540 and the second arm 1640ƒ may be driven independently of each other. In this case, in the pre-wetting step S00, the second arm 1640ƒ may move the pre-wetting nozzle 1510 to a region over the central region of the substrate W, and the pre-wetting nozzle 1510 may supply the pre-wetting liquid TH to the central region of the substrate W. Furthermore, in the coating step S10, the second arm 1640ƒ may move the wetting nozzle 1610ƒ to a region over the edge region of the substrate W, and the wetting nozzle 1610ƒ may spray the wetting medium M to the edge region of the substrate W.

Although it has been exemplified that the wetting unit 1600 is installed on the treatment vessel 1200, the inventive concept is not limited thereto. The wetting unit 1600 may be installed on an inner wall of the housing 1100. For example, the wetting unit 1600 may be installed on the inner wall of the housing 1100 in a position corresponding to the edge region of the substrate W supported on the support unit 1300.

Figure 26:
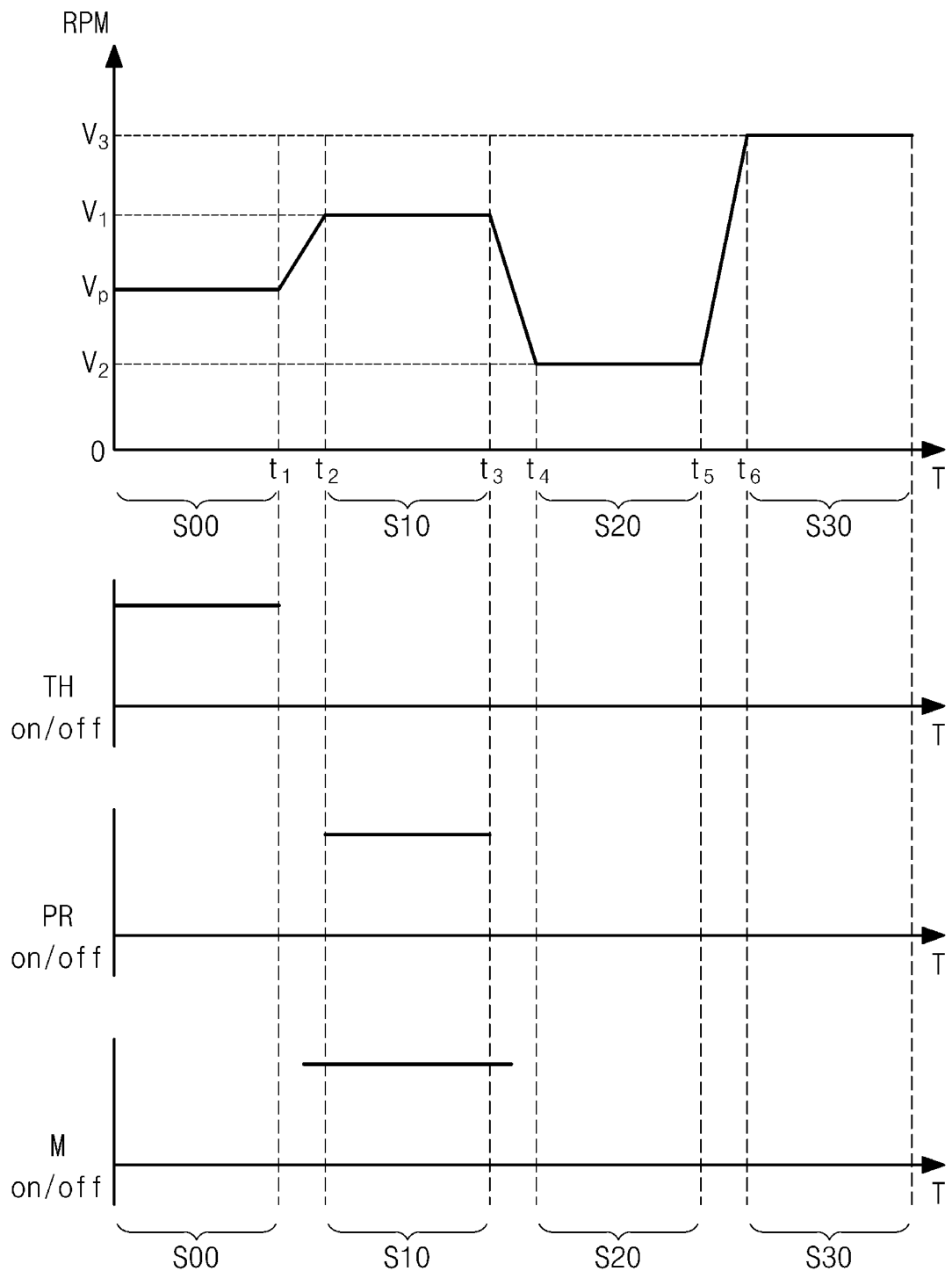
FIGS. 26 to 33 are views illustrating other examples of an RPM change of a substrate and time to supply treatment mediums to the substrate in a process of forming a liquid film on the substrate.

Although it has been exemplified that in the coating step S10, the liquid supply unit 1500 supplies the treatment liquid PR and the wetting unit 1600 sprays the wetting medium M from when the treatment liquid PR reaches the edge region of the substrate W, the inventive concept is not limited thereto. For example, as illustrated in FIG. 26, the wetting unit 1600 may spray the wetting medium M into the treatment space 1202 before the liquid supply unit 1500 supplies the treatment liquid PR (before the coating step S10 starts). That is, time to start spraying the wetting medium M may be earlier than time to start supplying the treatment liquid PR.

Figure 27:
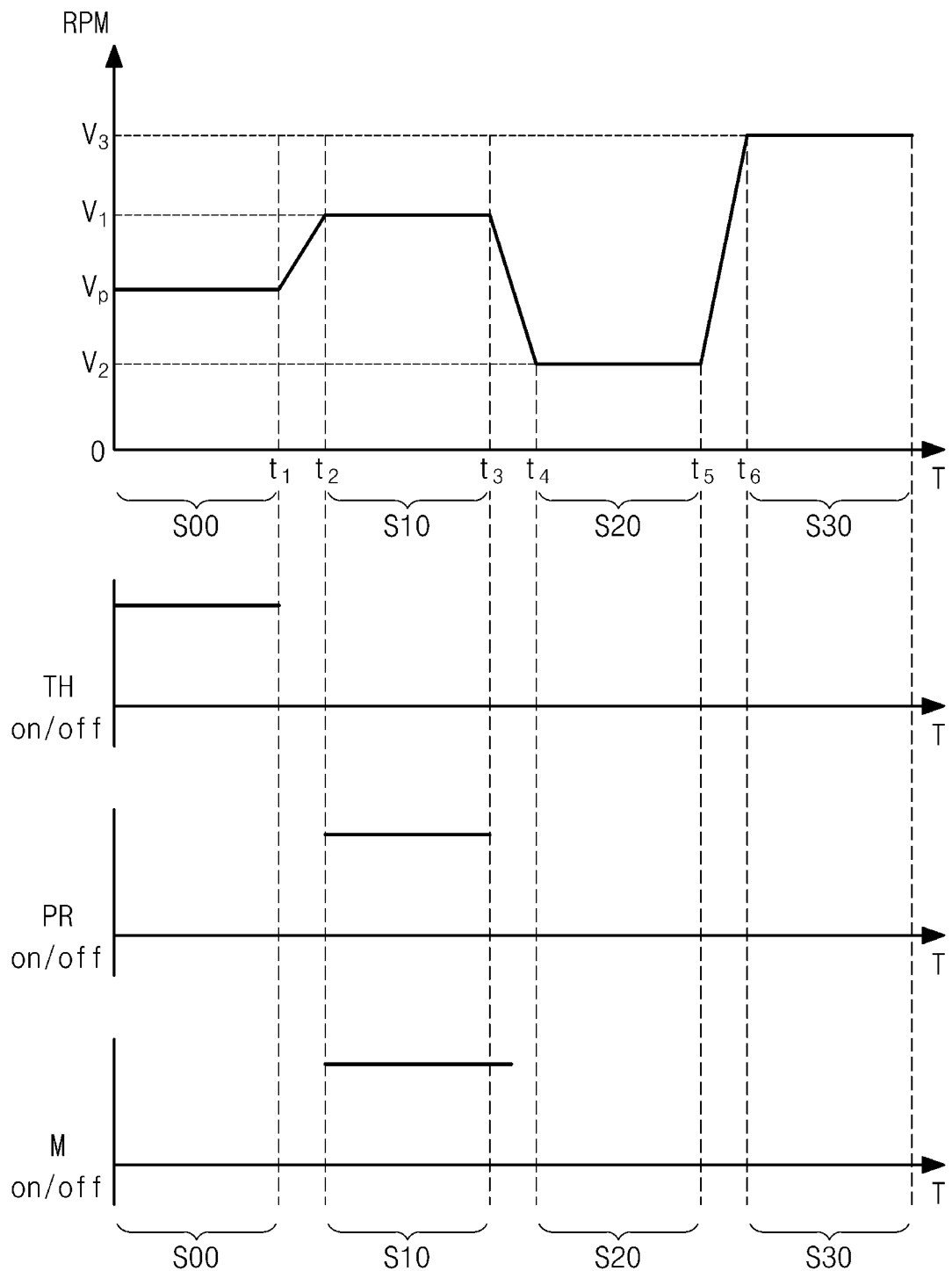

Although it has been exemplified that in the coating step S10, the liquid supply unit 1500 supplies the treatment liquid PR and the wetting unit 1600 sprays the wetting medium M from when the treatment liquid PR reaches the edge region of the substrate W, the inventive concept is not limited thereto. For example, as illustrated in FIG. 27, the wetting unit 1600 may spray the wetting medium M into the treatment space 1202 at the same time that the liquid supply unit 1500 supplies the treatment liquid PR. That is, time to start spraying the wetting medium M may be in agreement with time to start supplying the treatment liquid PR.

Figure 28:
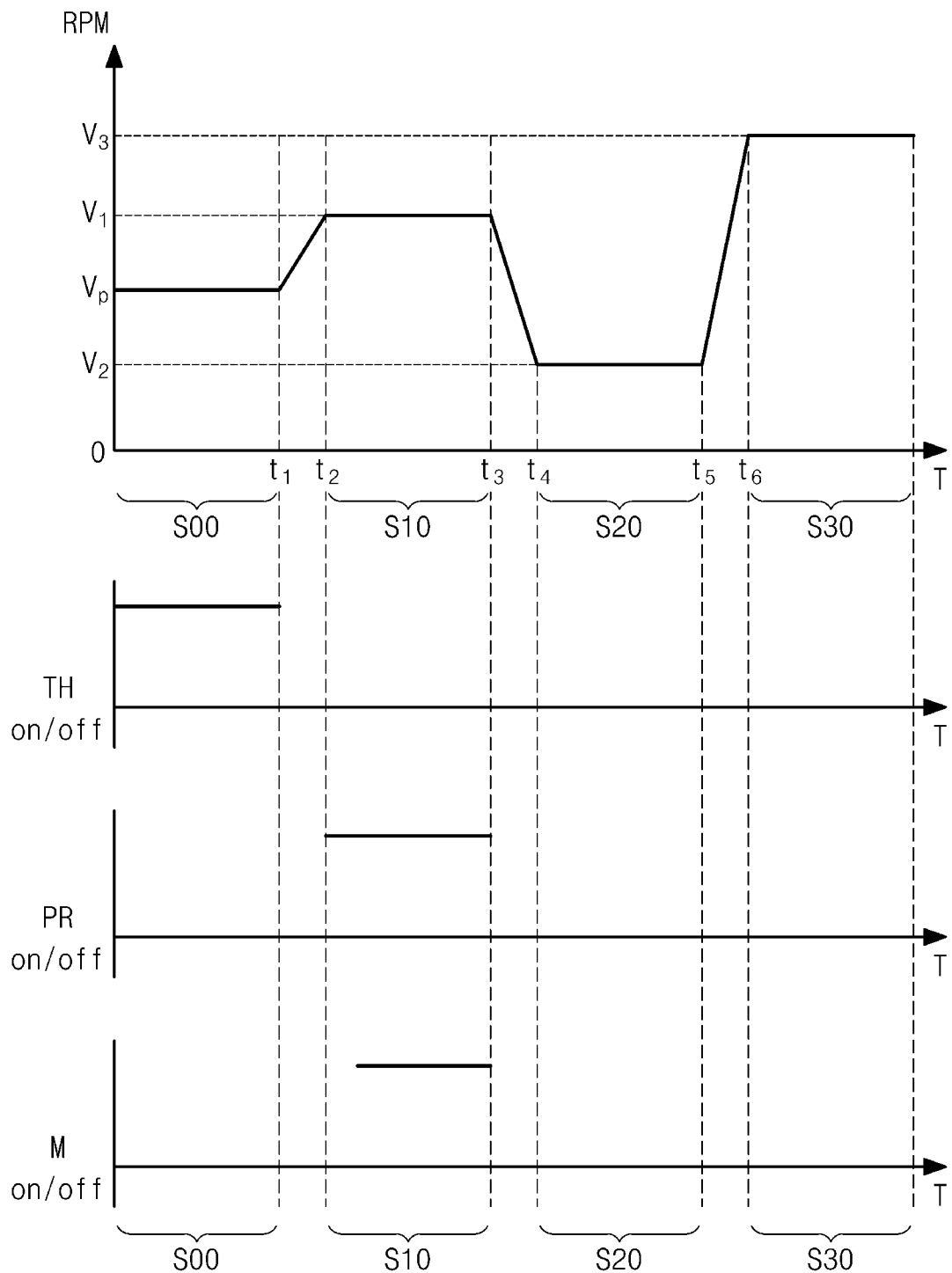
Figure 29:
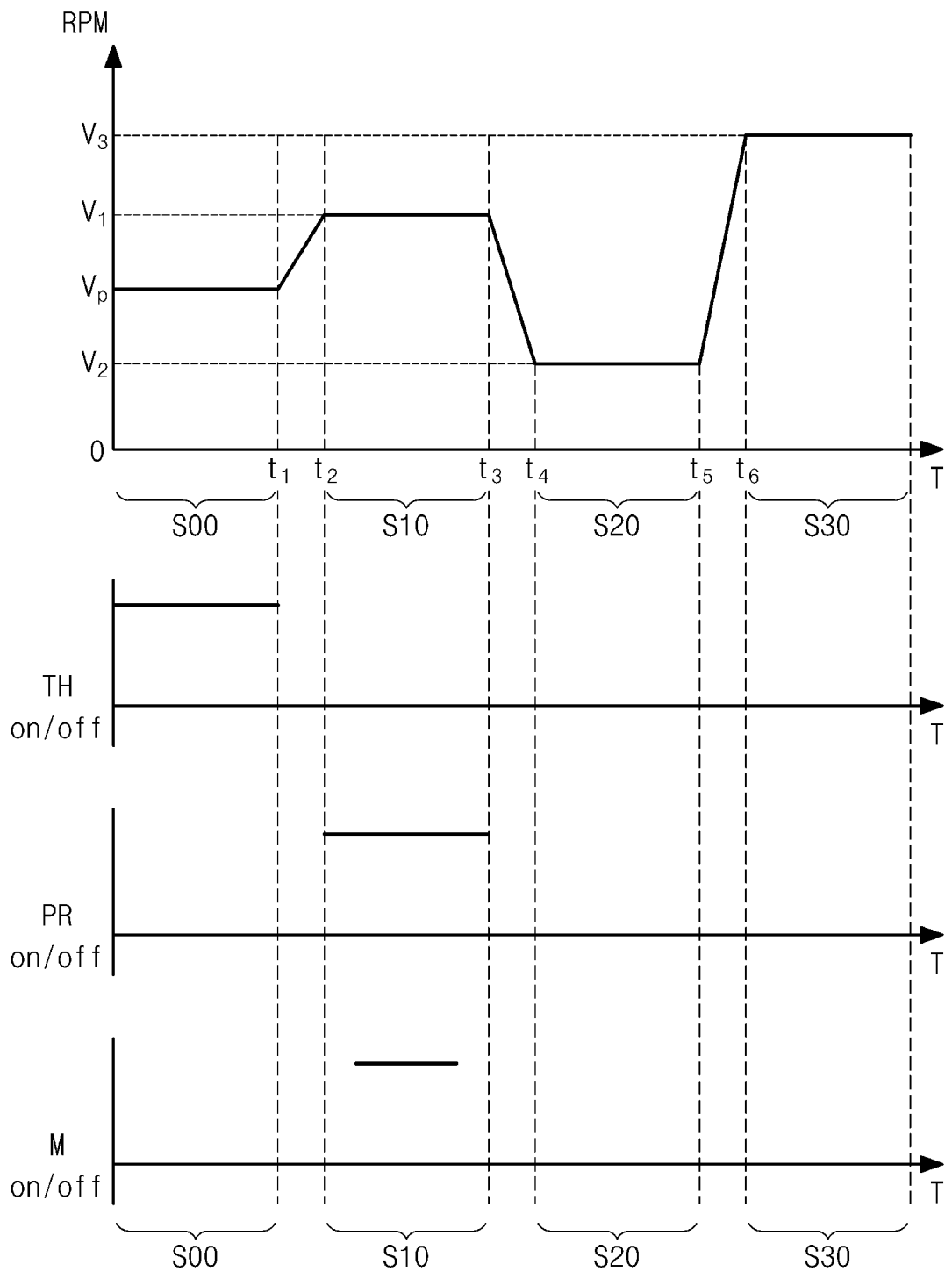

Although it has been exemplified that the wetting medium M is continually sprayed even after the supply of the treatment liquid PR is stopped, the inventive concept is not limited thereto. For example, as illustrated in FIG. 28, time to stop supplying the treatment liquid PR may be in agreement with time to stop spraying the wetting medium M. Alternatively, as illustrated in FIG. 29, time to stop spraying the wetting medium M may be earlier than time to stop supplying the treatment liquid PR.

Figure 30:
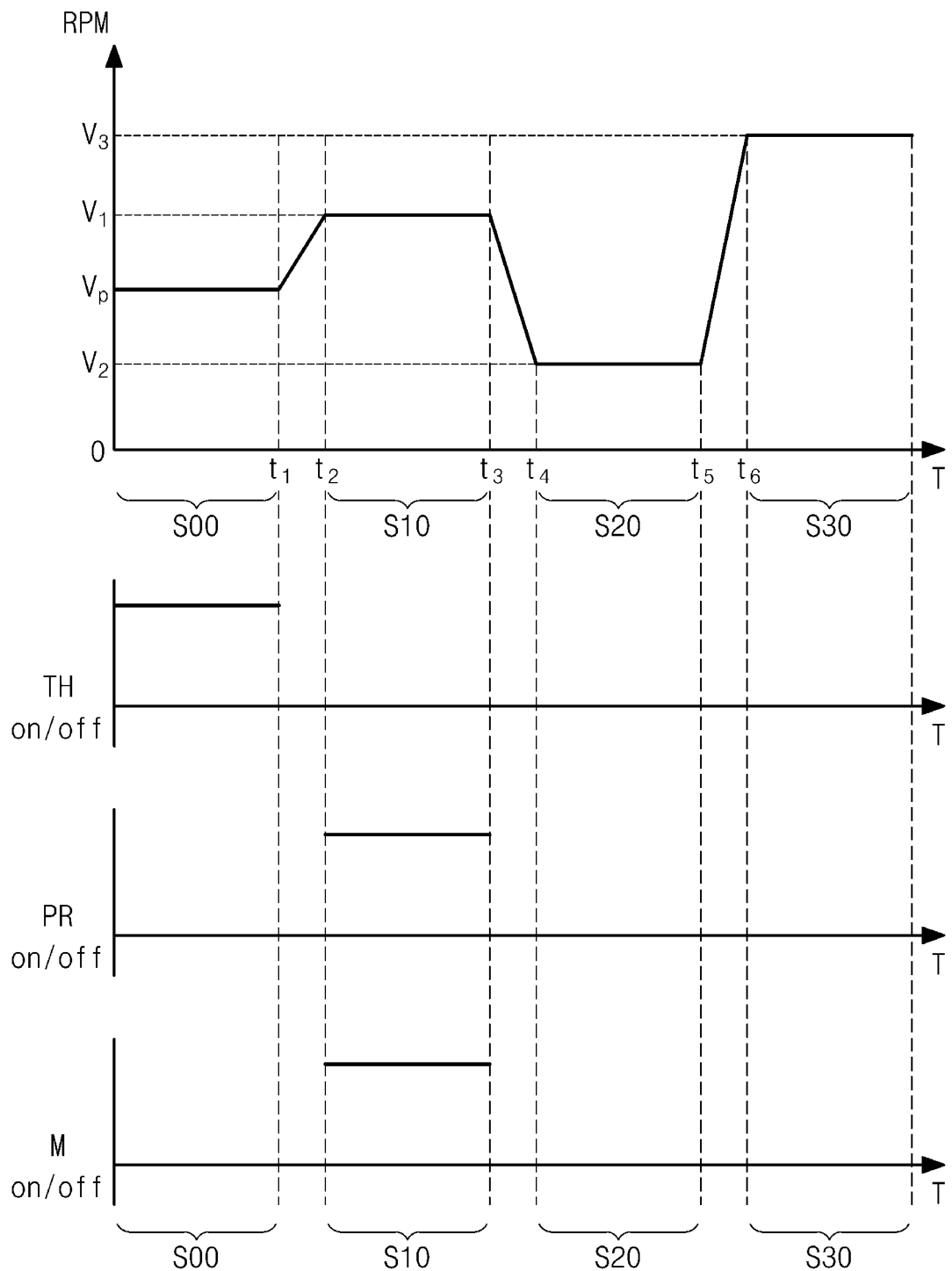

Although it has been exemplified that the time to start spraying the wetting medium M is later than the time to start supplying the treatment liquid PR and the time to stop spraying the wetting medium M is later than the time to stop supplying the treatment liquid PR, the inventive concept is not limited thereto. For example, as illustrated in FIG. 30, time to start spraying the wetting medium M and time to stop spraying the wetting medium M may be in agreement with time to start supplying the treatment liquid PR and time to stop supplying the treatment liquid PR, respectively.

Figure 31:
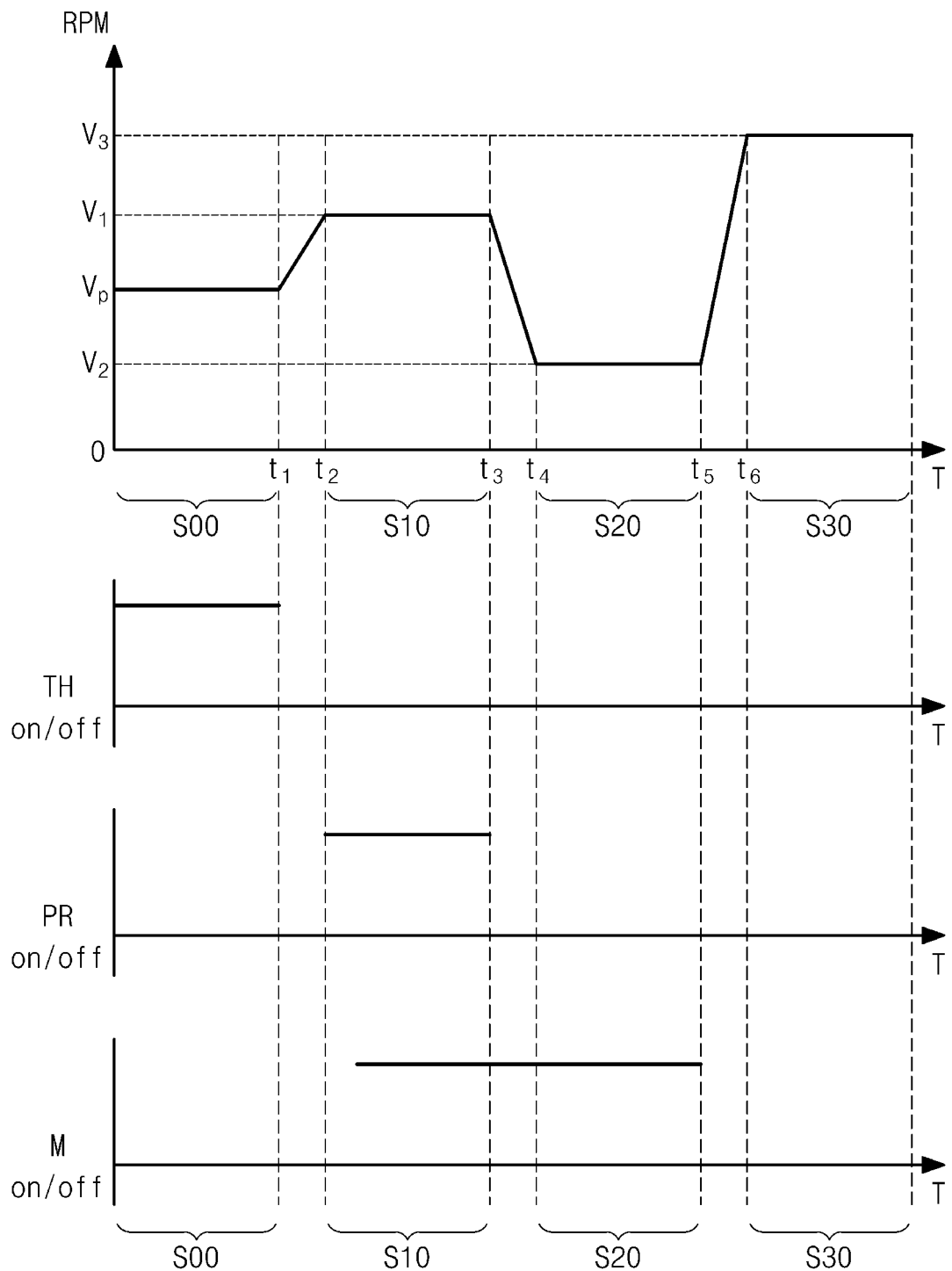
Figure 32:
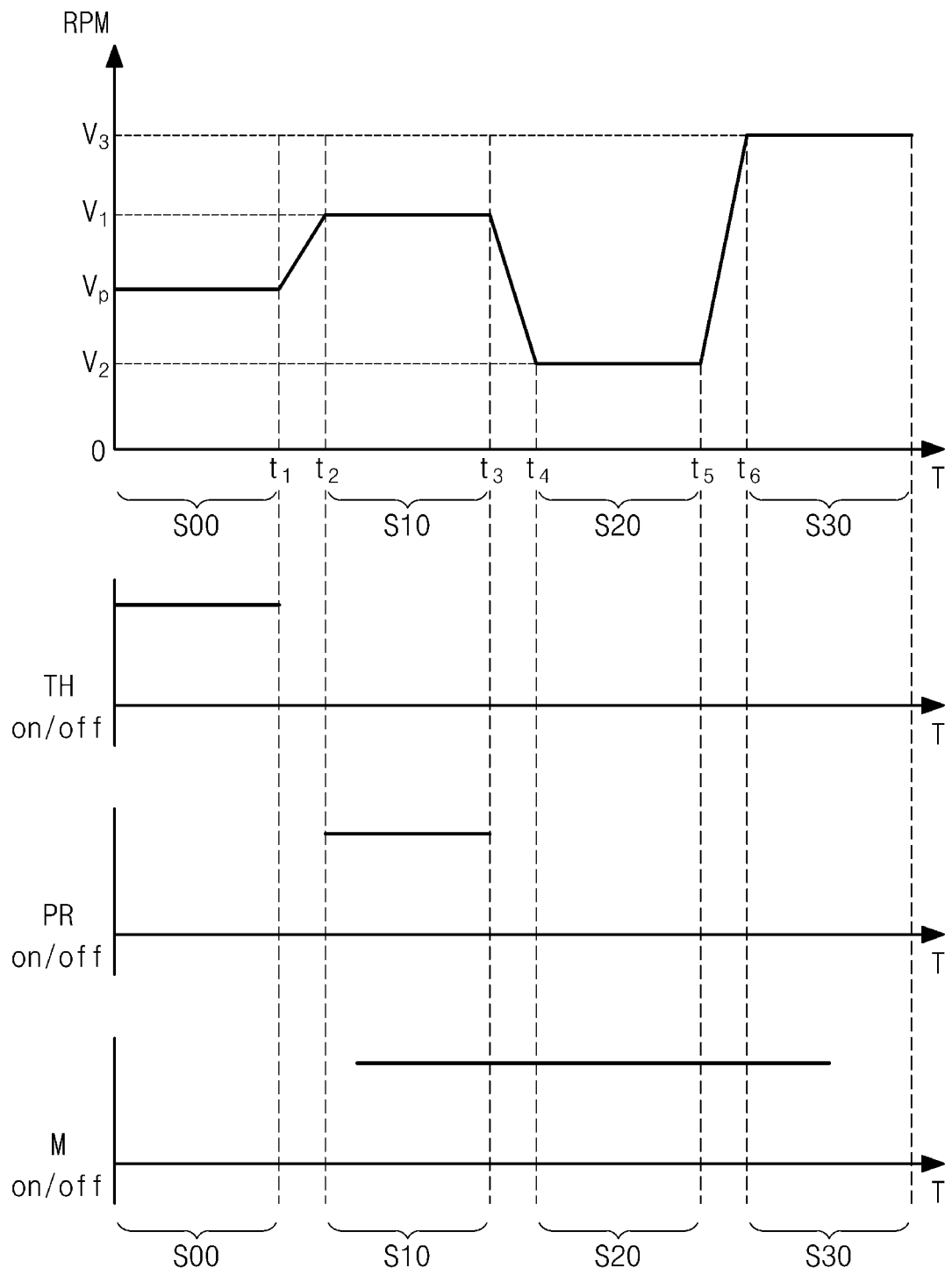
Figure 33:
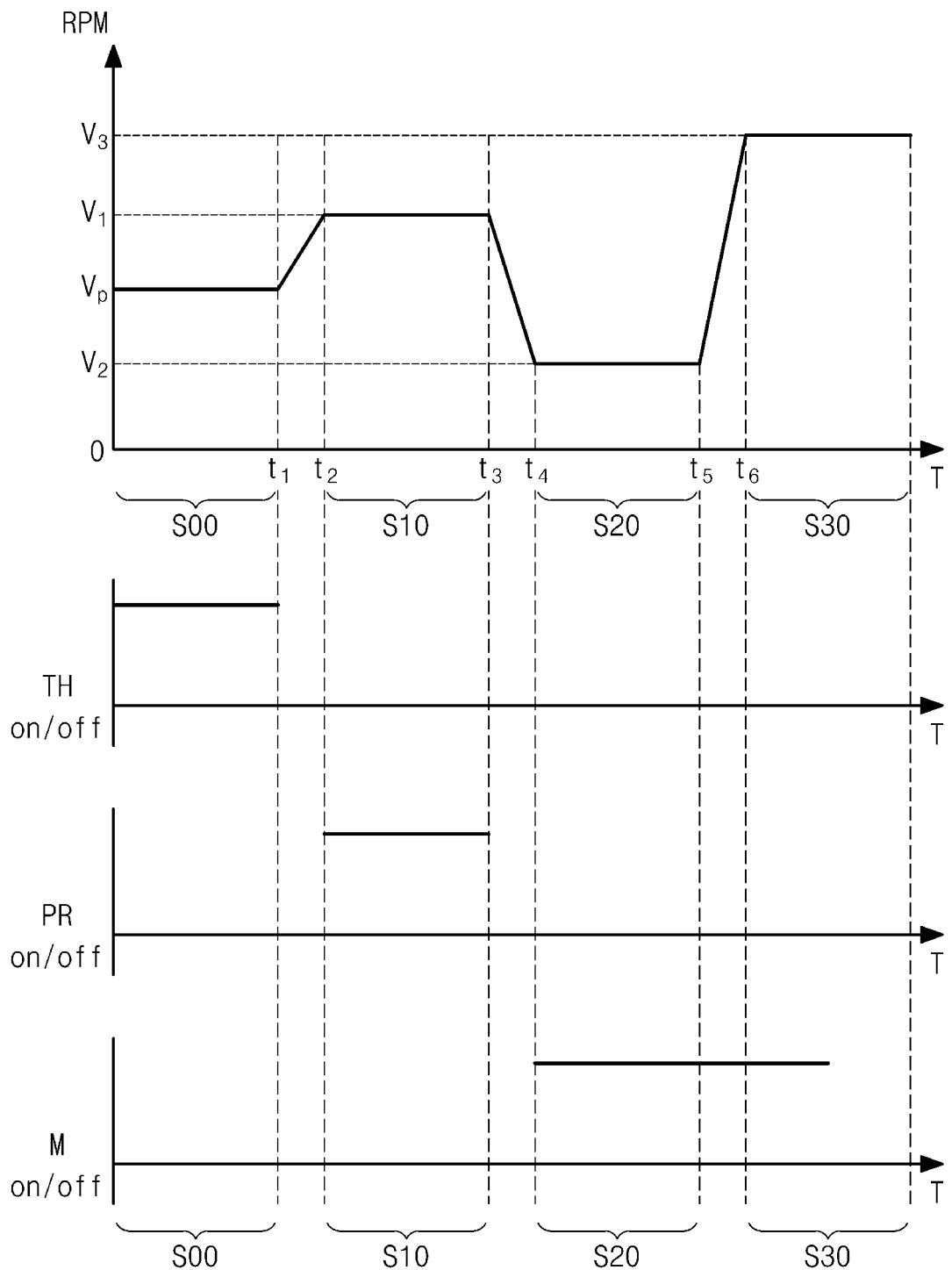

Although it has been exemplified that in the coating step S10, the wetting unit 1600 sprays the wetting medium M, the inventive concept is not limited thereto. For example, the wetting unit 1600 may spray the wetting medium M into the treatment space 1202 in at least one of the coating step S10, the thickness adjustment step S20, and the drying step S30. For example, as illustrated in FIG. 31, the wetting unit 1600 may spray the wetting medium M into the treatment space 1202 in the coating step S10 and the thickness adjustment step S20. Alternatively, as illustrated in FIG. 32, the wetting unit 1600 may spray the wetting medium M into the treatment space 1202 in the coating step S10, the thickness adjustment step S20, and the drying step S30. In another case, as illustrated in FIG. 33, the wetting unit 1600 may spray the wetting medium M in the thickness adjustment step S20 and the drying step S30. That is, the wetting unit 1600 may spray the wetting medium M after the supply of the treatment liquid PR is stopped. When the wetting medium M is sprayed in the drying step S30, the spray of the wetting medium M may be stopped before the drying step S30 ends. This is because the wetting medium M volatilizes faster than the treatment liquid PR, and this is to more rapidly dry the treatment liquid RP.

In another case, between the pre-wetting step S00, the coating step S10, the thickness adjustment step S20, and the drying step S30, the wetting unit 1600 may spray the wetting medium M into the treatment space 1202.

Referring again to FIGS. 3 and 4, the plurality of buffer chambers 312 and 316 are provided. Some of the buffer chambers 312 and 316 are disposed between the index module 100 and the transfer chamber 350. Hereinafter, these buffer chambers are referred to as the front buffers 312. The front buffers 312 are stacked one above another along the up/down direction. The other buffer chambers 316 are disposed between the transfer chamber 350 and the interface module 500. These buffer chambers are referred to as the rear buffers 316. The rear buffers 316 are stacked one above another along the up/down direction. The front buffers 312 and the rear buffers 316 temporarily store a plurality of substrates W. The substrates W stored in the front buffers 312 are loaded or unloaded by the index robot 132 and the transfer robot 352. The substrates W stored in the rear buffers 316 are loaded or unloaded by the transfer robot 352 and a first robot 552.

The developing blocks 300b have heat treatment chambers 320, a transfer chamber 350, and liquid treatment chambers 360. The heat treatment chambers 320 and the transfer chamber 350 of the developing blocks 300b are disposed in a structure substantially similar to the structure in which the heat treatment chambers 320 and the transfer chamber 350 of the coating blocks 300a are disposed. Therefore, description thereabout will be omitted.

The liquid treatment chambers 360 in the developing blocks 300b are provided as developing chambers 360, all of which identically supply a developing solution to perform a developing process on the substrate W.

The interface module 500 connects the treating module 300 with an external exposing apparatus 700. The interface module 500 has an interface frame 510, an additional process chamber 520, an interface buffer 530, and a transfer member 550.

The interface frame 510 may have, at the top thereof, a fan filter unit that forms a downward air flow in the interface frame 510. The additional process chamber 520, the interface buffer 530, and the transfer member 550 are disposed in the interface frame 510. The additional process chamber 520 may perform a predetermined additional process before the substrate W treated in the coating block 300a is transferred to the exposing apparatus 700. Selectively, the additional process chamber 520 may perform a predetermined additional process before the substrate W treated in the exposing apparatus 700 is transferred to the developing block 300b. According to an embodiment, the additional process may be an edge exposing process of exposing an edge region of the substrate W to light, a top-side cleaning process of cleaning the top side of the substrate W, or a backside cleaning process of cleaning the backside of the substrate W. A plurality of additional process chambers 520 may be provided. The additional process chambers 520 may be stacked one above another. The additional process chambers 520 may all perform the same process. Selectively, some of the additional process chambers 520 may perform different processes.

The interface buffer 530 provides a space in which the substrate W transferred between the coating blocks 300a, the additional process chambers 520, the exposing apparatus 700, and the developing blocks 300b temporarily stays while being transferred. A plurality of interface buffers 530 may be provided. The interface buffers 530 may be stacked one above another.

According to an embodiment, the additional process chambers 520 may be disposed on one side of an extension line facing the lengthwise direction of the transfer chamber 350, and the interface buffers 530 may be disposed on an opposite side of the extension line.

The transfer member 550 transfers the substrate W between the coating blocks 300a, the additional process chambers 520, the exposing apparatus 700, and the developing blocks 300b. The transfer member 550 may be implemented with one or more robots. According to an embodiment, the transfer member 550 has the first robot 552 and a second robot 554. The first robot 552 may transfer the substrate W between the coating blocks 300a, the additional process chambers 520, and the interface buffers 530. The second robot 554 may transfer the substrate W between the interface buffers 530 and the exposing apparatus 700 and may transfer the substrate W between the interface buffers 530 and the developing blocks 300b.

The first robot 552 and the second robot 554 each include a hand on which the substrate W is placed, and the hand is movable forward and backward, rotatable about an axis parallel to the third direction 16, and movable along the third direction 16.

The hands of the index robot 132, the first robot 552, and the second robot 554 may all have the same shape as the hand 354 of the transfer robot 352. Selectively, the hand of the robot that directly exchanges the substrate W with the transfer plate 3240 of each heat treatment chamber 3200 may have the same shape as the hand 354 of the transfer robot 352, and the hands of the remaining robots may have different shapes from the hand 354 of the transfer robot 352.

According to an embodiment, the index robot 132 may directly exchange the substrate W with the heating unit 3230 of the front heat treatment chamber 3200 provided in the coating block 300a. Furthermore, the transfer robots 352 provided in the coating block 300a and the developing block 300b may directly exchange the substrate W with the transfer plate 3240 located in the heat treatment chamber 320.

The apparatus and method for forming the liquid film on the substrate W by supplying the treatment liquid PR to the substrate W has been described above. However, the inventive concept is not limited thereto, and the above-described contents may be identically or similarly applied to an apparatus and method for treating the substrate W by supplying liquids to the substrate W.

As described above, according to the embodiments of the inventive concept, a substrate may be efficiently treated.

Furthermore, according to the embodiments of the inventive concept, uniformity of a liquid film formed on a substrate may be improved.

In addition, according to the embodiments of the inventive concept, defects, such as tearing and/or poor coating, in a liquid film formed on a substrate may be minimized.

Effects of the inventive concept are not limited to the aforementioned effects, and any other effects not mentioned herein may be clearly understood from this specification and the accompanying drawings by those skilled in the art to which the inventive concept pertains.

The above description exemplifies the inventive concept. Furthermore, the above-mentioned contents describe embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method for treating a substrate on a support unit in a treating space defined by a treatment vessel using a wetting unit spraying a wetting medium, comprising:
    performing a first step of forming a liquid film by supplying a treatment liquid to the substrate and rotating the substrate at a first speed;
    spraying the wetting medium in a form of mist to the substrate to facilitate spreading of the treatment liquid at an edge region of the substrate from an outside of a substrate perimeter when viewed in a plan view,
    wherein a time to start spraying the wetting medium is later than a time to start supplying the treatment liquid, and wherein the wetting unit is installed on an inclined portion of the treatment vessel to spray the wetting medium toward the edge region of the substrate supported on the support unit; and sensing whether the treatment liquid reaches the edge region of the substrate, wherein the spraying of the wetting medium begins in response to a sensing result that the treatment liquid reaches the edge region of the substrate.

2. The method of claim 1,
wherein the wetting medium is sprayed toward the edge region of the substrate.

3. The method of claim 1,
wherein a position where the wetting medium is supplied to the substrate is farther away from the center of the substrate than a position where the treatment liquid is supplied to the substrate.

4. The method of claim 1,
wherein the wetting medium is further sprayed for a set period of time after the supplying of the treatment liquid is stopped.

5. The method of claim 1, further comprising:
performing, after stopping supplying the treatment liquid in the first step, a second step of rotating the substrate provided with the treatment liquid in the first step at a second speed different from the first speed, and wherein the wetting medium is sprayed to the substrate in at least one of the first step and the second step.

6. The method of claim 5, further comprising:
performing a third step of rotating the substrate at a third speed higher than the first speed and the second speed, wherein the wetting medium is sprayed to the substrate in at least one of the first step, the second step, and the third step.

7. The method of claim 6,
wherein when the wetting medium is sprayed to the substrate in the third step, the spraying of the wetting medium is stopped before the third step ends.

8. A method for treating a substrate on a support unit in a treating space defined by a treatment vessel using a wetting unit spraying a wetting medium, comprising:
forming a liquid film by supplying a coating solution to a rotating substrate;
spraying the wetting medium in a form of mist to the substrate to suppress evaporation of a solvent contained in the liquid film from an outside of a substrate perimeter when viewed in a plan view, wherein time to start spraying the wetting medium is later than time to start supplying the coating solution, and wherein the wetting unit is installed on an inclined portion of the treatment vessel to spray the wetting medium toward an edge region of the substrate supported on the support unit; and sensing whether the coating solution reaches the edge region of the substrate, wherein the spraying of the wetting medium begins in response to a sensing result that the coating solution reaches the edge region of the substrate.

9. The method of claim 8,
wherein the coating solution is supplied toward a central region of the substrate, and the wetting medium is sprayed toward the edge region of the substrate.

10. The method of claim 8,
wherein a first time period during which the wetting medium is sprayed and a second time period during which the coating solution is supplied at least partially overlap each other.

11. The method of claim 8,
wherein time to stop spraying the wetting medium is later than time to stop supplying the coating solution.

12. A method for treating a substrate on a support unit in a treating space defined by a treatment vessel using a wetting unit spraying a thinner, comprising:
performing a coating step of forming a liquid film is formed by supplying a light-sensitive liquid to the substrate and rotating the substrate at a first speed;
spraying the thinner in a form of mist into a treatment space to adjust a degree of evaporation of a solvent contained in the liquid film from an outside of a substrate perimeter when viewed in a plan view, the substrate being treated in the treatment space, wherein a time to start spraying the thinner is later than a time to start supplying the light-sensitive liquid, and wherein the wetting unit is installed on an inclined portion of the treatment vessel to spray the thinner toward an edge region of the substrate supported on the support unit; and sensing whether the thinner reaches the edge region of the substrate, wherein the spraying of the thinner begins in response to a sensing result that the thinner reaches the edge region of the substrate.

13. The method of claim 12,
wherein the thinner is sprayed such that a concentration per unit volume of the thinner varies depending on regions of the substrate viewed from above.

14. The method of claim 13,
wherein the concentration per unit volume of the thinner sprayed into the treatment space is higher in the edge region of the substrate than in a central region of the substrate viewed from above.

15. The method of claim 12, further comprising:
performing a thickness adjustment step of stopping the supplying of the light-sensitive liquid and rotating the substrate provided with the light-sensitive liquid in the coating step at a second speed lower than the first speed; and
performing a drying step of drying the liquid film by rotating the substrate at a third speed higher than the second speed, and wherein the thinner is sprayed into the treatment space in at least one of the coating step, the thickness adjustment step, and the drying step.

* * * * *